(12) United States Patent
Oh et al.

(10) Patent No.: US 11,289,459 B2
(45) Date of Patent: Mar. 29, 2022

(54) APPARATUS AND METHOD FOR MANUFACTURING LIGHT-EMITTING DIODE MODULE

(71) Applicant: LUMENS CO., LTD., Yongin-si (KR)

(72) Inventors: Seung Hyun Oh, Yongin-si (KR); Sung Sik Jo, Yongin-si (KR); Jung Hyun Park, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 220 days.

(21) Appl. No.: 16/626,858

(22) PCT Filed: May 30, 2018

(86) PCT No.: PCT/KR2018/006142
§ 371 (c)(1),
(2) Date: Dec. 26, 2019

(87) PCT Pub. No.: WO2019/017584
PCT Pub. Date: Jan. 24, 2019

(65) Prior Publication Data
US 2020/0219854 A1    Jul. 9, 2020

(30) Foreign Application Priority Data

Jul. 18, 2017  (KR) .................. 10-2017-0090847
Jul. 18, 2017  (KR) .................. 10-2017-0090874
Oct. 25, 2017  (KR) .................. 10-2017-0139627

(51) Int. Cl.
*H01L 21/00* (2006.01)
*H01L 25/075* (2006.01)
(Continued)

(52) U.S. Cl.
CPC .......... *H01L 25/0753* (2013.01); *B65G 47/90* (2013.01); *H01L 21/67144* (2013.01); *H01L 33/62* (2013.01); *H01L 2933/0066* (2013.01)

(58) Field of Classification Search
CPC ........... H01L 25/0753; H01L 21/67144; H01L 33/62; B65G 47/90
See application file for complete search history.

(56) References Cited

U.S. PATENT DOCUMENTS

2008/0124842 A1 * 5/2008 Wang ..................... H01L 24/97
                                                                    438/118
2010/0107405 A1    5/2010 Kloeckner et al.
(Continued)

FOREIGN PATENT DOCUMENTS

KR    1997-0077392 A    12/1997
KR    10-2007-0044253 A    4/2007
(Continued)

*Primary Examiner* — Victor A Mandala
*Assistant Examiner* — Colleen E Snow
(74) *Attorney, Agent, or Firm* — Mei & Mark LLP

(57) ABSTRACT

The present invention relates to an apparatus and a method for manufacturing a light-emitting diode (LED) module and, more particularly, to an apparatus and a method for manufacturing a light-emitting diode module, which are capable of manufacturing a light emitting diode module on which a plurality of light-emitting diodes are mounted with an improved bonding speed and high accuracy by manufacturing the light-emitting diode module by simultaneously transferring the plurality of light emitting diodes onto a substrate by using a multi-eject pin or a multi-collet. An apparatus for manufacturing a light-emitting diode (LED) module according to one embodiment of the present invention, in which the light-emitting diode module comprises a plurality of light-emitting diodes each having one side surface with an exposed electrode surface and the other side surface corresponding to the one side surface, comprises: a sheet placement unit in which a sheet having a lower portion to which the other side surfaces of the plurality of light-emitting diodes are adhered is placed; a substrate placement unit in which a substrate is placed at a position corresponding to the (Continued)

sheet in the lower portion of the sheet, wherein the substrate has thereon a conductive pattern to which the one side surfaces of the plurality of light-emitting diodes are electrically contacted; and a multi-transfer unit having, on a higher portion of the sheet, a plurality of eject pins for transferring the plurality of light-emitting diodes adhered to the lower portion of the sheet onto the substrate, wherein the multi-transfer unit is characterized in that the plurality of eject pins transfer the plurality of light-emitting diodes onto the substrate.

20 Claims, 22 Drawing Sheets

(51) Int. Cl.
*H01L 33/62* (2010.01)
*B65G 47/90* (2006.01)
*H01L 21/67* (2006.01)

(56) References Cited

U.S. PATENT DOCUMENTS

2015/0371585 A1 12/2015 Bower et al.
2019/0371229 A1* 12/2019 Wang .................. H01L 33/387
2019/0378748 A1* 12/2019 Peterson ............. H01L 21/6875

FOREIGN PATENT DOCUMENTS

| KR | 10-2010-0007350 A | 1/2010 |
| KR | 10-2010-0050432 A | 5/2010 |
| KR | 10-1488609 B1 | 1/2015 |
| KR | 10-1501018 B1 | 3/2015 |
| KR | 10-2016-0092465 A | 8/2016 |
| KR | 10-2017-0020485 A | 2/2017 |

* cited by examiner

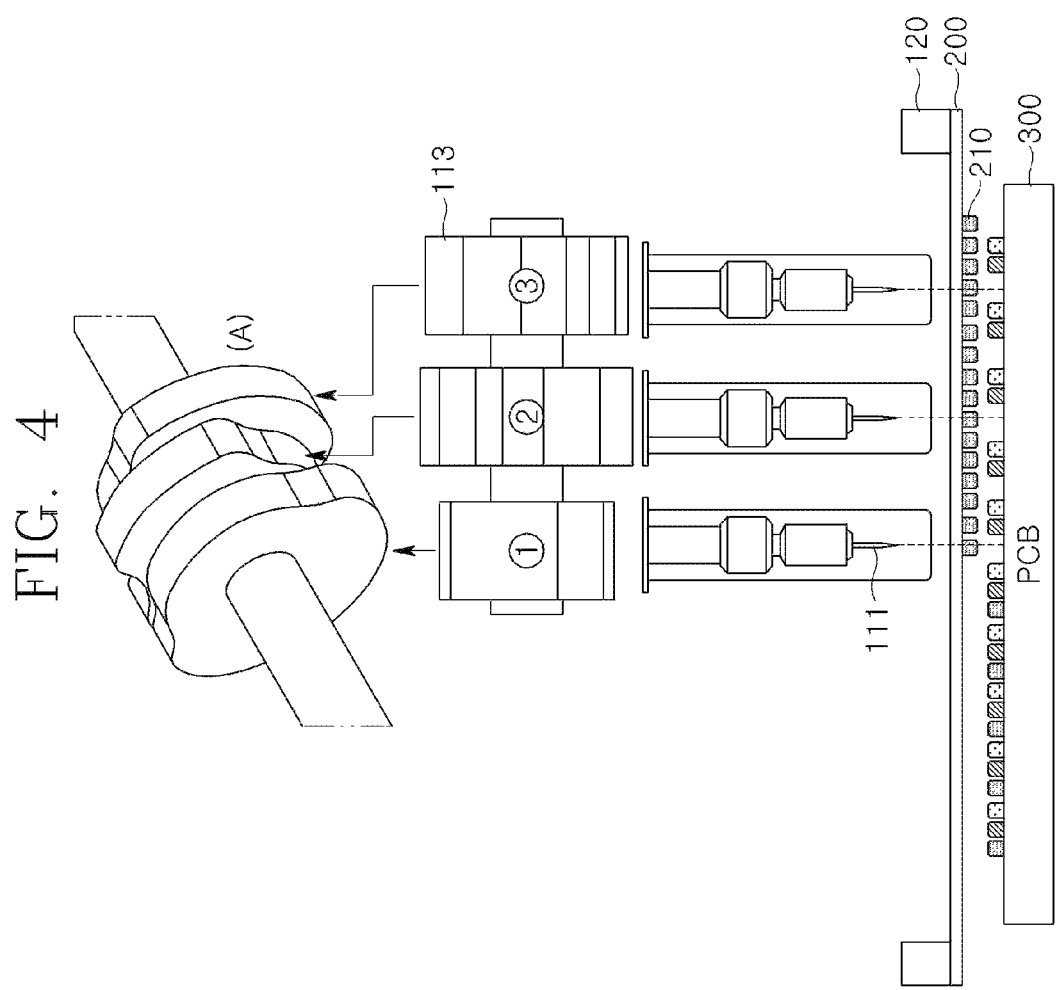

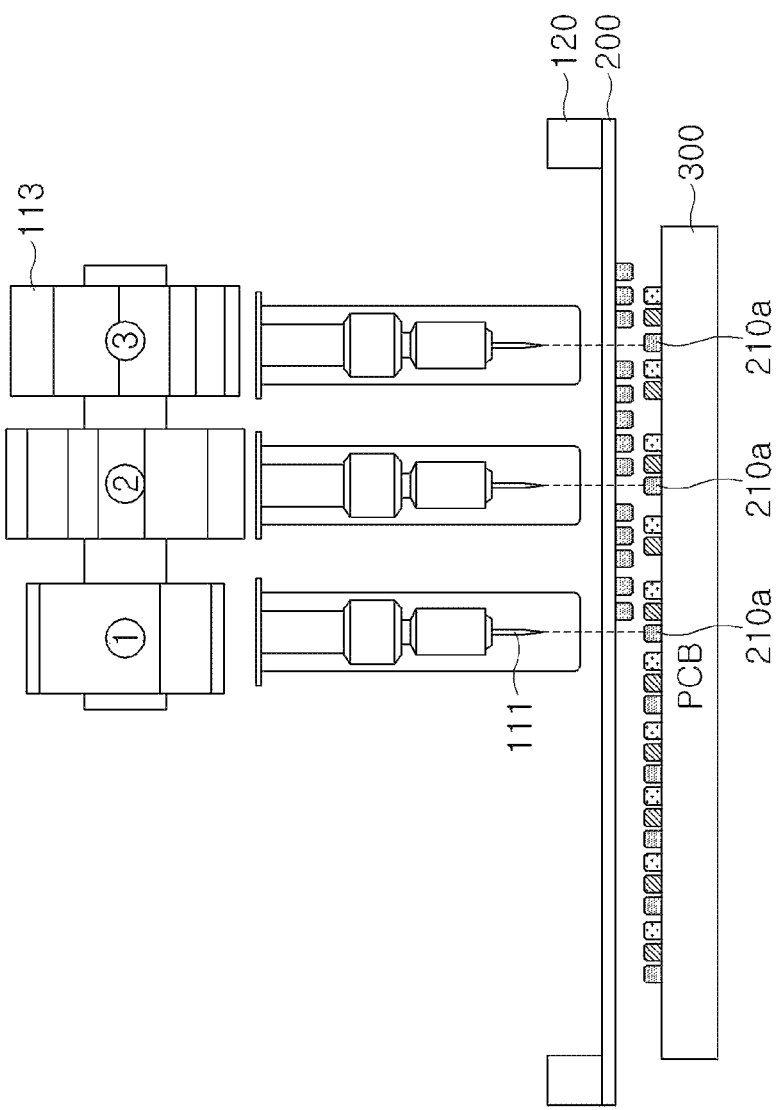

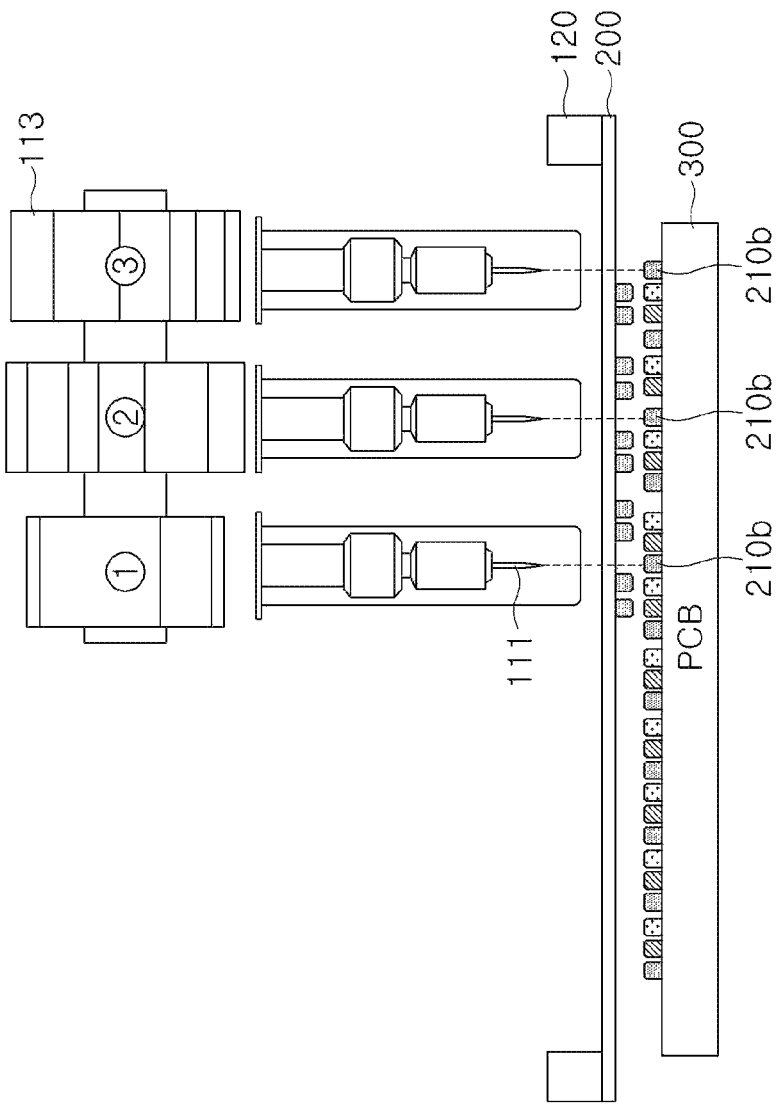

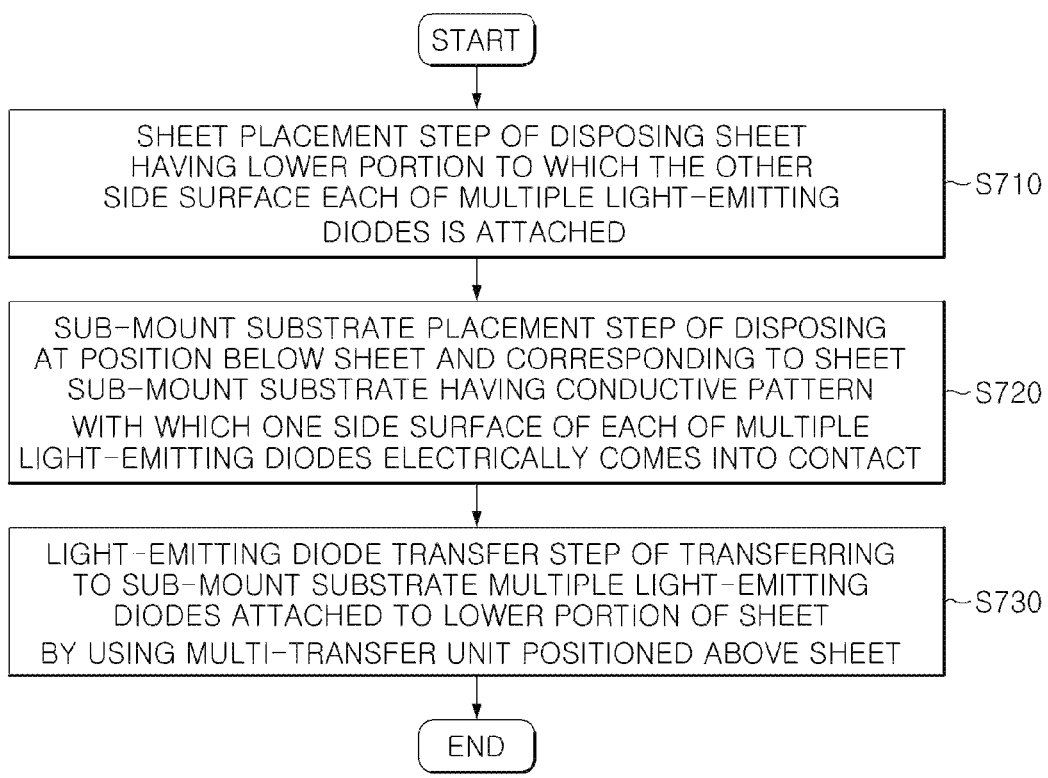

FIG. 9A
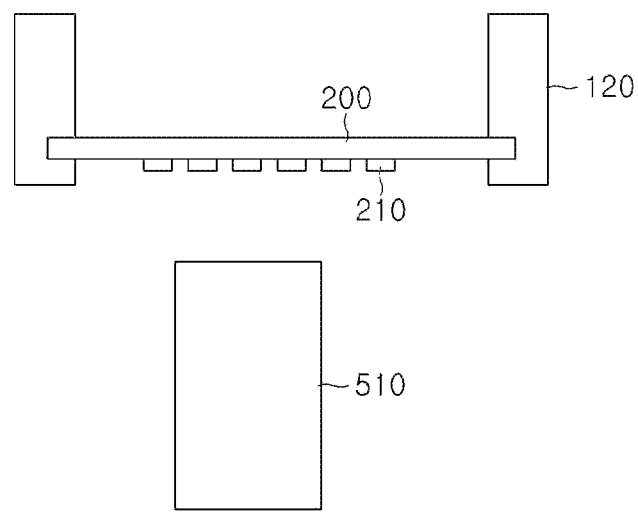
FIG. 9B
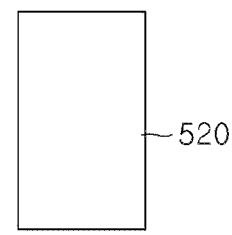
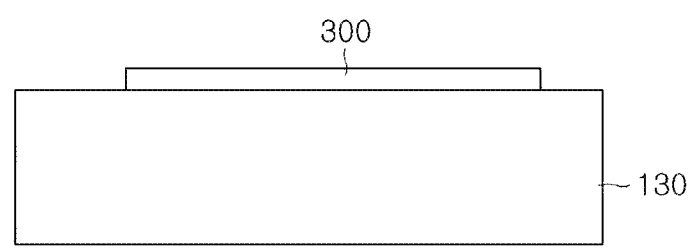

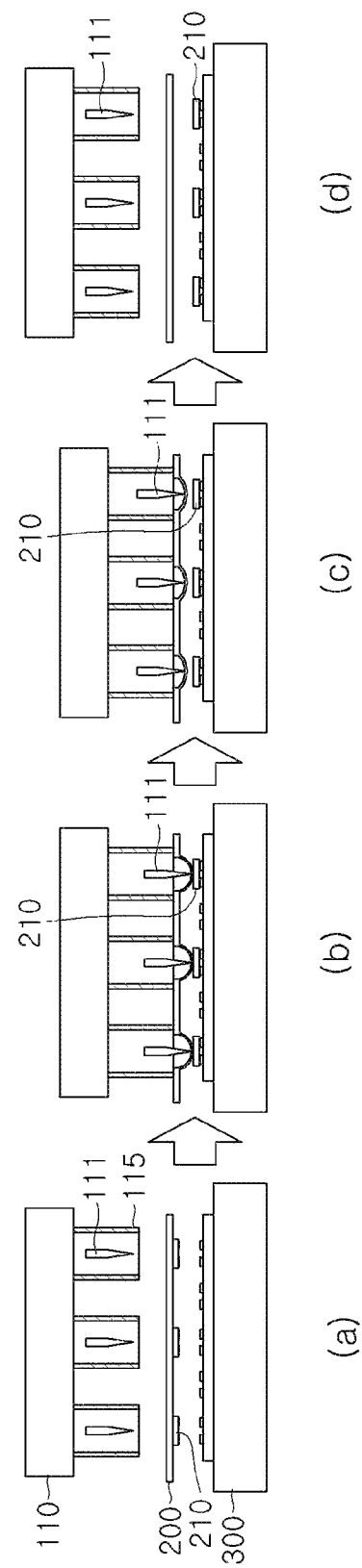

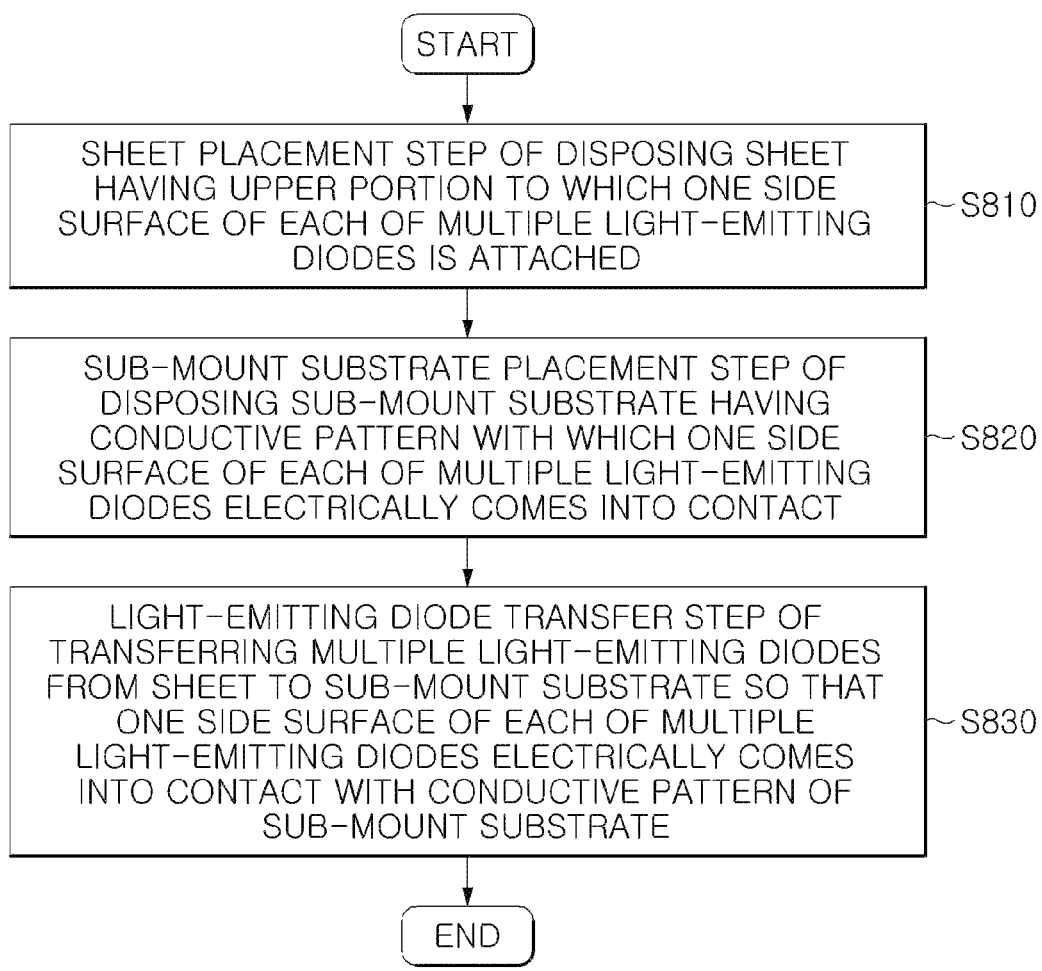

APPARATUS AND METHOD FOR MANUFACTURING LIGHT-EMITTING DIODE MODULE

TECHNICAL FIELD

The present invention relates to an apparatus and a method for manufacturing a light-emitting diode (LED) module, and more particularly, to an apparatus and a method for manufacturing a light-emitting diode module, which manufacture a light-emitting diode module by simultaneously transferring multiple light-emitting diodes to a substrate by using multiple ejection pins or multiple collets, such that it is possible to improve a bonding speed and manufacture, with high accuracy, the light-emitting diode module mounted with the multiple light-emitting diodes.

BACKGROUND ART

A light-emitting diode (LED) refers to a kind of semiconductor element capable of implementing a light-emitting source by using PN junction between semiconductor substances. The light-emitting diode (LED) is advantageous because the light-emitting diode is long in lifespan, compact in size, and light in weight, and may be operated with a low voltage. In addition, the light-emitting diode (LED) is strong against impact and vibration, requires neither warming-up time nor complicated operation, and may be mounted and then packaged in various shapes on a substrate or a lead frame. As a result, the light-emitting diode is modularized for various purposes and widely used for various types of lighting devices or display devices.

In this case, the light-emitting diode (LED) is manufactured in the form of a chip at a wafer level through a predetermined semiconductor process and transferred to a substrate or a substrate strip by a transfer device, and then the light-emitting diode is fixed to the substrate or the like through a reflow process. As illustrated in FIG. 1, Korean Patent No. 10-1501018 discloses a system that transfers and bonds light-emitting diodes and then performs a reflow process by using a chip bonding system and a reflow device.

Recently, there are increasing applications in which a light-emitting module is implemented by using multiple light-emitting diodes including red, green, and blue light-emitting diodes, or a display module is implemented by arranging multiple micro light-emitting diodes, such that various types of modules are implemented by bonding multiple light-emitting diodes. However, in a case in which the individual light-emitting diodes are sequentially bonded in the related art, the time taken to bond the multiple light-emitting diodes may rapidly increase, and deviations in positions and directions at/in which the multiple light-emitting diodes are bonded may be increased.

Further, in the related art, in order to transfer, to the substrate, the light-emitting diodes typically arranged on the sheet, collets positioned above the light-emitting diodes attract the light-emitting diodes, and ejection pins positioned below the light-emitting diodes eject the light-emitting diodes to easily separate the light-emitting diodes from the sheet. However, in this case, there is a risk that an epitaxial layer or the like positioned at a lower side of the light-emitting diode will be damaged when the ejection pin strikes the light-emitting diode.

In this regard, research is being conducted on a solution capable of quickly and accurately transferring the multiple light-emitting diodes and preventing damage during the transfer process, but no appropriate solution has yet been provided.

DISCLOSURE

Technical Problem

The present invention has been made in an effort to solve the above-mentioned problems, and an object of the present invention is to provide an apparatus and a method for manufacturing a light-emitting diode module, which are capable of improving a bonding speed for transferring multiple light-emitting diodes when manufacturing a light-emitting diode module having the multiple light-emitting diodes (LEDs).

Another object of the present invention is to provide an apparatus and a method for manufacturing a light-emitting diode module, which are capable of minimizing deviations in positions and directions at/in which multiple light-emitting diodes are bonded when manufacturing a light-emitting diode module by transferring the multiple light-emitting diodes (LEDs).

Still another object of the present invention is to provide an apparatus and a method for manufacturing a light-emitting diode module, which are capable of effectively inhibiting damage to the light-emitting diodes that may be caused when transferring the light-emitting diodes (LEDs).

The detailed objects of the present invention will be apparently identified and understood by experts or researches in this technical field through the specific description disclosed below.

Technical Solution

In order to solve the above-mentioned problems, an exemplary embodiment of the present invention provides an apparatus for manufacturing a light-emitting diode module including multiple light-emitting diodes each having one side surface from which an electrode surface is exposed, and the other side surface opposite to one side surface, the apparatus including a sheet placement unit configured to dispose a sheet having a lower portion to which the other side surface of each of the multiple light-emitting diodes is attached, a substrate placement unit configured to dispose, at a position below the sheet and corresponding to the sheet, a substrate having a conductive pattern with which one side surface of each of the multiple light-emitting diodes electrically comes into contact, and a multi-transfer unit having multiple ejection pins configured to transfer, to the substrate, the multiple light-emitting diodes attached to the lower portion of the sheet from above the sheet, in which the multiple ejection pins of the multi-transfer unit transfer the multiple light-emitting diodes to the substrate.

Here, the multiple ejection pins of the multi-transfer unit may be individually operated.

In this case, the multi-transfer unit may transfer some of the light-emitting diodes to the substrate by operating only some of the multiple ejection pins.

In addition, the multi-transfer unit may simultaneously transfer the multiple light-emitting diodes to the substrate by operating the multiple ejection pins downward from above the sheet and pushing the multiple light-emitting diodes.

In addition, the multi-transfer unit may transfer the multiple light-emitting diodes to the substrate so that an interval between the multiple light-emitting diodes is equal to or a multiple of a pitch between the multiple light-emitting diodes attached to the sheet.

In addition, the other side surface of the light-emitting diode may be attached to the sheet, one or more electrodes may be positioned on the electrode surface of one side surface opposite to the other side surface, and the ejection pin may push the other side surface and transfer the light-emitting diode so that the one or more electrodes electrically come into contact with the conductive pattern of the substrate.

In addition, each of the multiple light-emitting diodes may be a light-emitting diode having at least one ejection point formed on the other side surface thereof.

In addition, the light-emitting diode module may be a display module on which cells including red, green, and blue micro light-emitting diodes are arranged at a predetermined interval, and the multi-transfer unit may have a structure in which the multiple ejection pins are arranged at the predetermined interval or arranged at an interval which is a multiple of the predetermined interval.

In addition, the sheet placement unit may include a first alignment unit configured to align a first sheet having multiple first light-emitting diodes, and a second alignment unit configured to align a second sheet having multiple second light-emitting diodes each having a wavelength different from a wavelength of the first light-emitting diode, and the multi-transfer unit may simultaneously transfer the multiple first light-emitting diodes to multiple cells and then simultaneously transfer the multiple second light-emitting diodes to the multiple cells.

In addition, the multi-transfer unit may have a sheet attraction unit configured to attract the sheet, and the sheet attraction unit may attract the sheet to separate the sheet and the light-emitting diode after the ejection pin transfers the light-emitting diode to the substrate by pushing the light-emitting diode.

In addition, the multi-transfer unit may have a pressure adjustment unit configured to adjust a pressure to be applied to the light-emitting diode from the ejection pin, and the pressure adjustment unit may adjust the pressure to be applied to the light-emitting diode from the ejection pin when the ejection pin transfers the light-emitting diode to the substrate by pushing the light-emitting diode.

Another exemplary embodiment of the present invention provides a method of manufacturing a light-emitting diode module including multiple light-emitting diodes each having one side surface from which an electrode surface is exposed, and the other side surface opposite to one side surface, the method including a sheet placement step of disposing a sheet having a lower portion to which the other side surface of each of the multiple light-emitting diodes is attached, a substrate placement step of disposing, at a position below the sheet and corresponding to the sheet, a substrate having a conductive pattern with which one side surface of each of the multiple light-emitting diodes electrically comes into contact, and a light-emitting diode transfer step of transferring, to the substrate, the multiple light-emitting diodes attached to the lower portion of the sheet by using a multi-transfer unit positioned above the sheet, in which in the light-emitting diode transfer step, the multi-transfer unit has multiple ejection pins, and the multiple ejection pins transfer, to the substrate, the multiple light-emitting diodes on the sheet.

Here, the other side surface of each of the multiple light-emitting diodes may be attached to the sheet, one or more electrodes may be positioned on the electrode surface of one side surface opposite to the other side surface, and in the light-emitting diode transfer step, the ejection pin may push the other side surface and transfer the light-emitting diode so that the one or more electrodes electrically come into contact with the conductive pattern of the substrate.

In addition, each of the multiple light-emitting diodes may be a light-emitting diode having at least one ejection point formed on the other side surface thereof.

In addition, in the light-emitting diode transfer step, the multi-transfer unit may simultaneously transfer the multiple light-emitting diodes to the substrate by operating the multiple ejection pins downward from above the sheet and pushing the multiple light-emitting diodes.

In this case, in the light-emitting diode transfer step, the multi-transfer unit may transfer some of the light-emitting diodes to the substrate by operating only some of the multiple ejection pins.

In addition, in the light-emitting diode transfer step, the multi-transfer unit may transfer the multiple light-emitting diodes to the substrate so that an interval between the multiple light-emitting diodes is equal to or a multiple of a pitch between the multiple light-emitting diodes attached to the sheet.

Further, the sheet placement step may align the sheet so that the light-emitting diodes selected among the multiple light-emitting diodes are moved to positions corresponding to the multiple ejection pins.

Here, the light-emitting diode module may be a display module on which cells including red, green, and blue micro light-emitting diodes are arranged at a predetermined interval, and in the light-emitting diode transfer step, the multiple ejection pins, which are arranged at the predetermined interval or arranged at an interval which is a multiple of the predetermined interval, may be used to transfer the multiple light-emitting diodes.

In addition, the sheet placement step may include a first alignment step of aligning a first sheet having multiple first light-emitting diodes, and a second alignment step of aligning a second sheet having multiple second light-emitting diodes each having a wavelength different from a wavelength of the first light-emitting diode, and the light-emitting diode transfer step may simultaneously transfer the multiple first light-emitting diodes to multiple cells and then simultaneously transfer the multiple second light-emitting diodes to the multiple cells.

In addition, the multi-transfer unit may have a sheet attraction unit configured to attract the sheet, and in the light-emitting diode transfer step, the sheet attraction unit may attract the sheet to separate the sheet and the light-emitting diode after the ejection pin transfers the light-emitting diode to the substrate by pushing the light-emitting diode.

In addition, the multi-transfer unit may have a pressure adjustment unit configured to adjust a pressure to be applied to the light-emitting diode from the ejection pin, and in the light-emitting diode transfer step, the pressure adjustment unit may adjust the pressure to be applied to the light-emitting diode from the ejection pin when the ejection pin transfers the light-emitting diode to the substrate by pushing the light-emitting diode.

Still another exemplary embodiment of the present invention provides an apparatus for manufacturing a light-emitting diode module including multiple light-emitting diodes each having one side surface from which an electrode surface is exposed, and the other side surface opposite to one side surface, the apparatus including a sheet placement unit configured to dispose a sheet having an upper portion to which one side surface of each of the multiple light-emitting diodes is attached, a sub-mount substrate placement unit configured to dispose a sub-mount substrate having a conductive pattern with which one side surface of each of the multiple light-emitting diodes electrically comes into contact, and a multi-transfer unit having multiple collets configured to separate the multiple light-emitting diodes from the sheet and move the multiple light-emitting diodes to the sub-mount substrate, in which the multiple collets attract the other side surface of each of the light-emitting diodes and move the light-emitting diodes to the sub-mount substrate.

In addition, the multi-transfer unit may further include multiple ejection pins corresponding to the multiple collets.

In addition, the multiple ejection pins may separate the multiple light-emitting diodes from the sheet by striking one side surface of each of the multiple light-emitting diodes attached to the sheet.

In this case, the multiple ejection pins may strike one side surface of each of the multiple light-emitting diodes while the multiple collets attract the other side surface of each of the multiple light-emitting diodes.

In addition, the multiple ejection pins may strike one side surface of each of the multiple light-emitting diodes after the multiple collets attract the other side surface of each of the multiple light-emitting diodes.

In addition, each of the multiple light-emitting diodes may be a light-emitting diode including at least one edge finger on one side surface thereof.

In addition, each of the multiple light-emitting diodes may be a light-emitting diode having at least one ejection point formed on one side surface thereof.

In addition, the multi-transfer unit may transfer the multiple light-emitting diodes to the sub-mount substrate so that an interval between the multiple light-emitting diodes is equal to or a multiple of a pitch between the multiple light-emitting diodes attached to the upper portion of the sheet.

In addition, the multi-transfer unit may be structured to face the sheet and the sub-mount substrate by being rotated, the multi-transfer unit may simultaneously attract the multiple light-emitting diodes in a state in which the multi-transfer unit is rotated at a first angle to face the sheet, and then the multi-transfer unit may simultaneously transfer the multiple light-emitting diodes to the sub-mount substrate in a state in which the multi-transfer unit is rotated at a second angle to face the substrate.

In addition, the light-emitting diode module may be a display module on which cells including red, green, and blue micro light-emitting diodes are arranged at a predetermined interval, and the multi-transfer unit may have multiple collets arranged at the predetermined interval or arranged at an interval which is a multiple of the predetermined interval.

In this case, the sheet placement unit may include a first alignment unit configured to align a first sheet having multiple first light-emitting diodes, and a second alignment unit configured to align a second sheet having multiple second light-emitting diodes each having a wavelength different from a wavelength of the first light-emitting diode, and the multi-transfer unit may simultaneously transfer the multiple first light-emitting diodes to multiple cells and then simultaneously transfer the multiple second light-emitting diodes to the multiple cells.

Yet another exemplary embodiment of the present invention provides a method of manufacturing a light-emitting diode module including multiple light-emitting diodes each having one side surface from which an electrode surface is exposed, and the other side surface opposite to one side surface, the method including a sheet placement step of disposing a sheet having an upper portion to which one side surface of each of the multiple light-emitting diodes is attached, a sub-mount substrate placement step of disposing a sub-mount substrate having a conductive pattern with which one side surface of each of the multiple light-emitting diodes electrically comes into contact, and a light-emitting diode transfer step of transferring the multiple light-emitting diodes from the sheet to the sub-mount substrate so that one side surface of each of the multiple light-emitting diodes electrically comes into contact with the conductive pattern of the sub-mount substrate, in which in the light-emitting diode transfer step, multiple collets attract the other side surface of each of the multiple light-emitting diodes on the sheet, and multiple ejection pins corresponding to the multiple collets separate the multiple light-emitting diodes from the sheet by striking one side surface of each of the multiple light-emitting diodes.

In this case, one side surface of each of the multiple light-emitting diodes may include at least one edge finger, first and second electrodes having different polarities may be provided on one side surface of each of the multiple light-emitting diodes, and the first and second electrodes may be attached to the sheet.

In addition, each of the multiple light-emitting diodes may be a light-emitting diode having at least one ejection point formed on one side surface thereof.

In addition, in the light-emitting diode transfer step, two or more of the multiple collets may be simultaneously operated, such that the two or more light-emitting diodes may be simultaneously transferred to the sub-mount substrate.

In addition, in the light-emitting diode transfer step, the multi-transfer unit may be structured to face the sheet and the sub-mount substrate by being rotated, the multi-transfer unit may simultaneously attract the multiple light-emitting diodes in a state in which the multi-transfer unit is rotated at a first angle to face the sheet, and then the multi-transfer unit may simultaneously transfer the multiple light-emitting diodes to the sub-mount substrate in a state in which the multi-transfer unit is rotated at a second angle to face the sub-mount substrate.

In addition, in the light-emitting diode transfer step, all of the multiple light-emitting diodes moved to the sub-mount substrate may have the same height based on the sub-mount substrate.

Further, the sheet placement step may include aligning the sheet so that the light-emitting diodes selected among the multiple light-emitting diodes are moved to positions corresponding to the multiple collets.

In addition, the light-emitting diode module may be a display module on which cells including red, green, and blue micro light-emitting diodes are arranged at a predetermined interval, and in the light-emitting diode transfer step, the multiple collets, which are arranged at the predetermined interval or arranged at an interval which is a multiple of the predetermined interval, may be used to transfer the multiple light-emitting diodes.

In this case, the sheet placement step may include a first alignment step of aligning a first sheet having multiple first light-emitting diodes, and a second alignment step of aligning a second sheet having multiple second light-emitting diodes each having a wavelength different from a wavelength of the first light-emitting diode, and the light-emitting diode transfer step may simultaneously transfer the multiple first light-emitting diodes to multiple cells and then simultaneously transfer the multiple second light-emitting diodes to the multiple cells.

Advantageous Effects

According to the apparatus and the method for manufacturing a light-emitting diode module according to the exemplary embodiment of the present invention, the light-emitting diode module is manufactured by simultaneously transferring, to the substrate, the multiple light-emitting diodes arranged on the sheet by using the multi-transfer unit including the multiple ejection pins, as a result of which it is possible to manufacture the light-emitting diode module by transferring the multiple light-emitting diodes LED at an improved speed.

In addition, according to the apparatus and the method for manufacturing a light-emitting diode module according to the exemplary embodiment of the present invention, the multiple light-emitting diodes LED are transferred to the substrate disposed below the sheet and at the positions corresponding to the sheet by using the multiple ejection pins positioned above the sheet, as a result of which it is possible to minimize deviations in positions and directions at/in which the multiple light-emitting diodes are bonded.

In addition, according to the apparatus and the method for manufacturing a light-emitting diode module according to the exemplary embodiment of the present invention, the light-emitting diodes are transferred to the substrate by ejecting the upper surfaces of the light-emitting diodes with the ejection pins, as a result of which it is possible to effectively inhibit damage to the light-emitting diodes that may be caused during the process of transferring the light-emitting diodes LED.

In addition, according to the apparatus and the method for manufacturing a light-emitting diode module according to the exemplary embodiment of the present invention, the light-emitting diode module is manufactured by simultaneously transferring the multiple light-emitting diodes to the substrate by using the multi-transfer unit including the multiple collets, as a result of which it is possible to improve efficiency in manufacturing the light-emitting diode module by transferring the multiple light-emitting diodes (LEDs) at a high speed.

In addition, according to the apparatus and the method for manufacturing a light-emitting diode module according to the exemplary embodiment of the present invention, the multiple light-emitting diodes (LEDs) are simultaneously transferred to the substrate by using the multiple collets, as a result of which it is possible to minimize deviations in positions and directions at/in which the multiple light-emitting diodes are bonded.

DESCRIPTION OF DRAWINGS

The accompanying drawings included as a part of the detailed description for helping to understand the present invention provide exemplary embodiments of the present invention, and the technical spirit of the present invention will be described with reference to the detailed description.

FIG. 4 is an exemplified view for explaining an operation of a multi-transfer unit of the light-emitting diode module manufacturing apparatus according to the exemplary embodiment of the present invention.

FIGS. 6A and 6B are exemplified views for explaining a process in which light-emitting diodes are transferred by the multi-transfer unit of the light-emitting diode module manufacturing apparatus according to the exemplary embodiment of the present invention.

FIG. 7 is a flowchart illustrating a light-emitting diode module manufacturing method according to an exemplary embodiment of the present invention.

FIGS. 9A and 9B are views for explaining an operation of scanning a sheet and a substrate in the light-emitting diode module manufacturing apparatus according to the exemplary embodiment of the present invention.

FIGS. 10A and 10B are views for explaining a process of transferring light-emitting diodes by using a sheet attraction unit of the light-emitting diode module manufacturing apparatus according to the exemplary embodiment of the present invention.

FIG. 18 is a flowchart illustrating the light-emitting diode module manufacturing method according to the exemplary embodiment of the present invention.

BEST MODE

Figure 1:
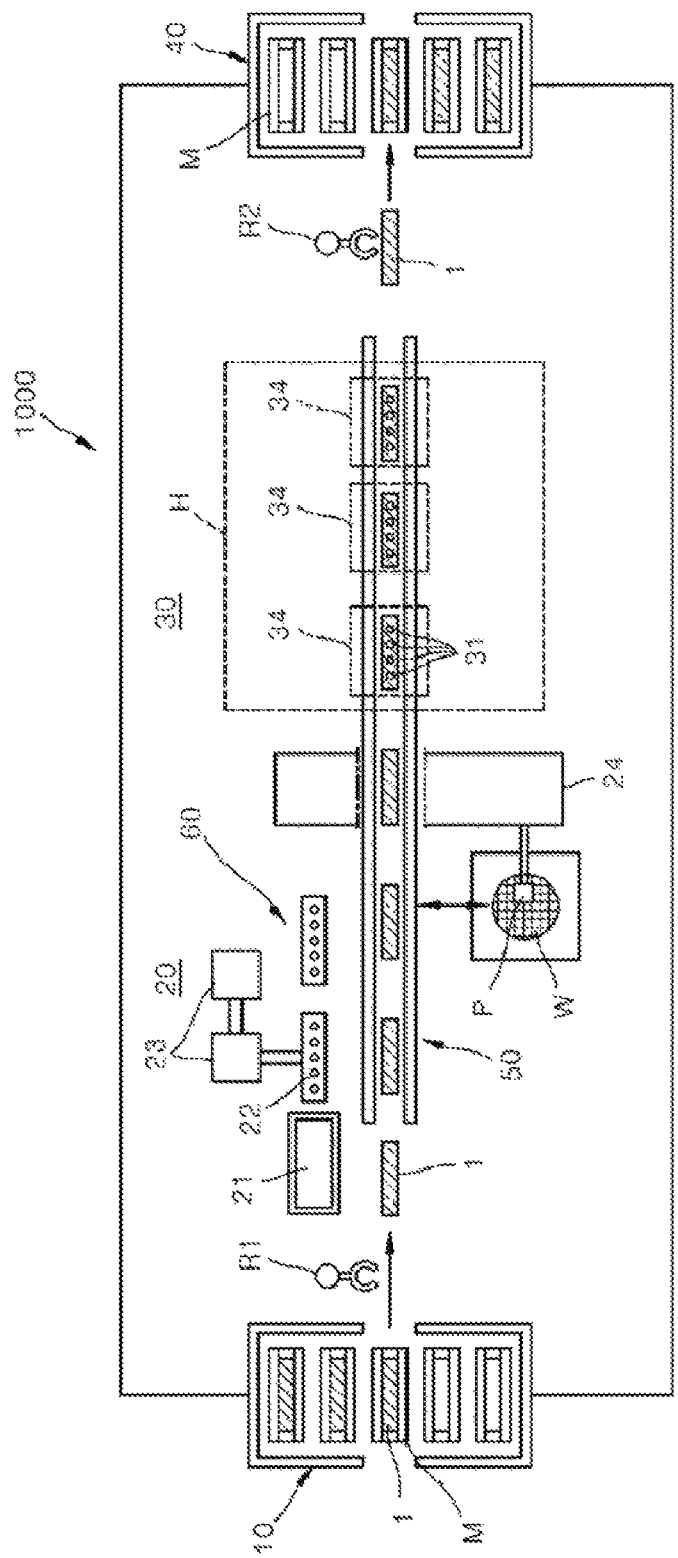
FIG. 1 is an exemplified view of a chip bonding system in the related art.

Hereinafter, exemplary embodiments of the present invention will be described in detail with reference to the accompanying drawings. First, in assigning reference numerals to constituent elements of the respective drawings, it should be noted that the same constituent elements will be designated by the same reference numerals, if possible, even though the constituent elements are illustrated in different drawings. In addition, in the description of the present invention, the specific descriptions of publicly known related configurations or functions will be omitted when it is determined that the specific descriptions may obscure the subject matter of the present invention. Further, the exemplary embodiments of the present invention will be described below, but the technical spirit of the present invention is not limited thereto and may of course be carried out by those skilled in the art.

Hereinafter, exemplary embodiments of an apparatus and a method for manufacturing a light-emitting diode module according to the present invention will be described in detail with reference to the accompanying drawings.

Figure 2:
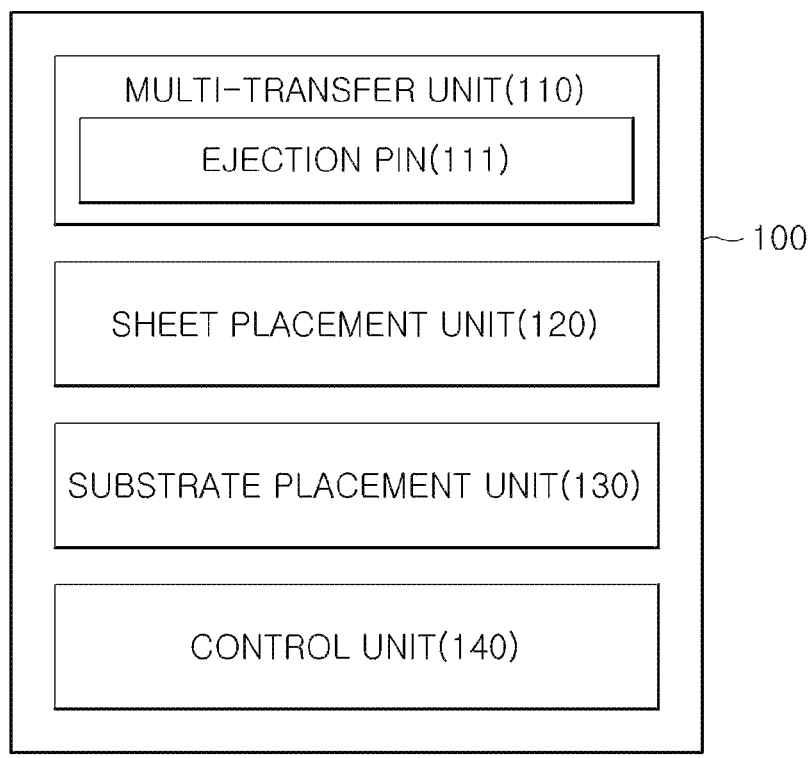
FIG. 2 is a configuration view of a light-emitting diode module manufacturing apparatus according to an exemplary embodiment of the present invention.

First, FIG. 2 is a configuration view illustrating a light-emitting diode module manufacturing apparatus according to an exemplary embodiment of the present invention. As illustrated in FIG. 2, a light-emitting diode module manufacturing apparatus 100 according to an exemplary embodiment of the present invention is an apparatus for manufacturing a light-emitting diode module including multiple light-emitting diodes 210 each having one side surface from which an electrode surface is exposed, and the other side surface opposite to one side surface. The light-emitting diode module manufacturing apparatus 100 may include a multi-transfer unit 110, a sheet placement unit 120, a substrate placement unit 130, and a control unit 140.

First, the sheet placement unit 120 disposes, at a predetermined position, a sheet 200 having a lower portion to which the other side surface of each of the multiple light-emitting diodes 210 is attached. Further, the sheet placement unit 120 may include a structure for accurately aligning the sheet 200 at the predetermined position.

In addition, the substrate placement unit 130 disposes a substrate 300 at a position below the sheet 200 and corresponding to the sheet 200, and the substrate 300 is formed with a conductive pattern with which one side surface of each of the multiple light-emitting diodes 210 electrically comes into contact. Further, the substrate placement unit 130 may also have a structure for accurately aligning the substrate 300 at the predetermined position.

In this case, the multi-transfer unit 110 is provided above the sheet 200. The multi-transfer unit 110 uses multiple ejection pins 111 and transfers, to the substrate 300, the multiple light-emitting diodes 210 attached to the lower portion of the sheet 200. In this case, the multi-transfer unit 110 operates the multiple ejection pins 111 and pushes and transfers the multiple light-emitting diodes 210 to the substrate 300.

More specifically, the multi-transfer unit 110 operates the multiple ejection pins 111 downward from above the sheet 200, thereby simultaneously pushing and transferring the multiple light-emitting diodes 210 to the substrate 300.

Further, the multi-transfer unit 110 may transfer the multiple light-emitting diodes 210 to the substrate 300 so that an interval between the multiple light-emitting diodes 210 is equal to or a multiple of a pitch between the multiple light-emitting diodes 210 attached to the sheet 200.

In addition, in the present invention, for the light-emitting diode 210, a light-emitting diode element in the form of a chip manufactured at a wafer level will be mainly described as an example, but the present invention is not necessarily limited thereto, and an example in which a light-emitting diode element in the form of a chip is packaged may also be applied.

In addition, the light-emitting diode module manufacturing apparatus 100 according to the exemplary embodiment of the present invention may include the control unit 140 that uses a microprocessor or the like and controls the operations of the multi-transfer unit 110, the sheet placement unit 120, and the substrate placement unit 130.

In addition, the multiple ejection pins 111 of the multi-transfer unit 110 may be individually operated. Further, only some of the multiple ejection pins 111 may be operated to select only some of the multiple light-emitting diodes 210 arranged on the sheet 200 and then transfer the selected light-emitting diodes 210 to the substrate 300.

In order to cope with the increase in bonding time and the increase in deviation of the bonding position and the bonding direction of the multiple light-emitting diodes 210, which may be caused at the time of manufacturing a light-emitting diode module by bonding the multiple light-emitting diodes 210 such as manufacturing a light-emitting module by using the multiple light-emitting diodes 210 including red, green, and blue light-emitting diodes or manufacturing a display module by arranging the multiple micro light-emitting diodes 210, the light-emitting diode module manufacturing apparatus 100 according to the exemplary embodiment of the present invention uses the multi-transfer unit 110 including the multiple ejection pins 111 and simultaneously transfers, to the substrate 300, the multiple light-emitting diodes 210 arranged on the sheet 200, thereby manufacturing the light-emitting diode module. As a result, it is possible to improve a speed of bonding the multiple light-emitting diodes 210 and to minimize a deviation in position and direction of the multiple light-emitting diodes 210.

Hereinafter, the light-emitting diode module manufacturing apparatus according to the exemplary embodiment of the present invention will be described in detail with reference to the respective drawings.

Figure 3A:
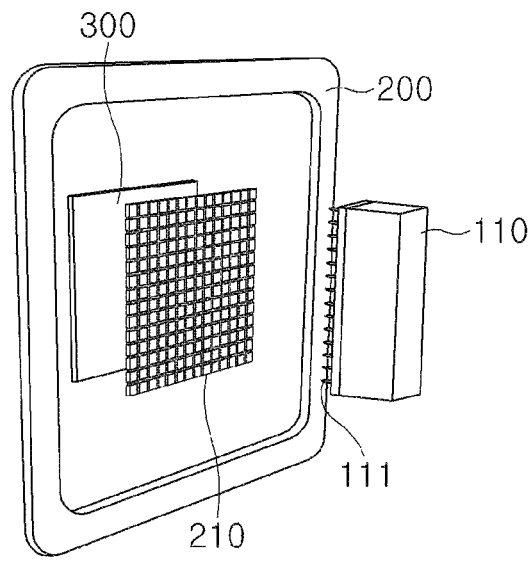
FIGS. 3A and 3B are views for explaining an operation of the light-emitting diode module manufacturing apparatus using multiple ejection pins according to the exemplary embodiment of the present invention.
Figure 3B:
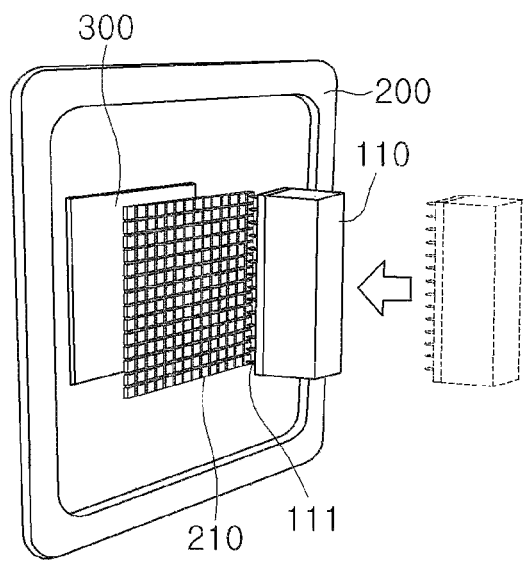

FIGS. 3A and 3B illustrate the light-emitting diode module manufacturing apparatus using the multi-transfer unit 110 having the multiple ejection pins 111 according to the exemplary embodiment of the present invention. As illustrated in FIG. 3A, in the present invention, the sheet 200 on which the light-emitting diodes 210 are arranged is positioned above the substrate 300, and the multi-transfer unit 110 having the multiple ejection pins 111 is positioned above the first sheet 200.

In addition, the multiple light-emitting diodes 210 may be attached to and arranged on the sheet 200. In addition, various structures having the multiple light-emitting diodes 210, such as a strip to which the multiple light-emitting diodes 210 are transferred, may be provided so that the multiple light-emitting diodes 210 may be transferred to the substrate 300 by the operations of the ejection pins 111.

In this case, the multi-transfer unit 110, the sheet 200, and the substrate 300 may be aligned by using a camera or the like, such that the light-emitting diodes 210 to be transferred, the multi-transfer unit 110 having the multiple ejection pins 111 for pushing and transferring the light-emitting diodes 210, and the substrate 300 to which the light-emitting diodes 210 are to be transferred may be accurately aligned at positions and in directions corresponding to one another.

Further, as illustrated in FIG. 3B, the multi-transfer unit 110 is operated to simultaneously eject the multiple light-emitting diodes 210 arranged on the sheet 200, thereby transferring the multiple light-emitting diodes 210 to the substrate 300.

More specifically, FIG. 4 illustrates the operation of the multi-transfer unit 110 having the multiple ejection pins according to the exemplary embodiment of the present invention. As illustrated in FIG. 4, in the exemplary embodiment of the present invention, the sheet 200 having the multiple light-emitting diodes 210 is positioned above the substrate 300, and the multi-transfer unit 110 having the multiple ejection pins 111 is positioned above the sheet 200. In this case, the sheet 200 may be aligned in the position and direction with the multi-transfer unit 110 and the substrate 300 by being moved or rotated by the sheet placement unit 120. Further, the sheet 200 may be aligned in the position and direction with the substrate 300 by moving or rotating the substrate 300.

Further, as illustrated in FIG. 4, the multi-transfer unit 110 operates the multiple ejection pins 111 to eject the multiple first light-emitting diode (e.g., red light-emitting diodes) 210 provided on the sheet 200, thereby transferring the multiple first light-emitting diode 210 to the substrate 300.

In this case, the multiple first light-emitting diodes 210 may be provided on a lower surface of the sheet 200 and positioned opposite to the substrate 300. Therefore, the multi-transfer unit 110 may be operated to allow the multiple first light-emitting diodes 210 to be seated directly on the substrate 300 by the multiple ejection pins 111, as a result of which it is possible to quickly and accurately transfer the multiple first light-emitting diodes 210 to the substrate without moving the multi-transfer unit 110.

Further, the other side surface of each of the light-emitting diodes 210 may be attached to the sheet 200, and one or more electrodes may be positioned on the electrode surface of one side surface opposite to the other side surface. Therefore, the ejection pin 111 is operated to push the other side surface, such that the light-emitting diode 210 may be transferred so that the one or more electrodes of the light-emitting diode 210 is electrically in contact with the conductive pattern of the substrate 300.

Figure 5:
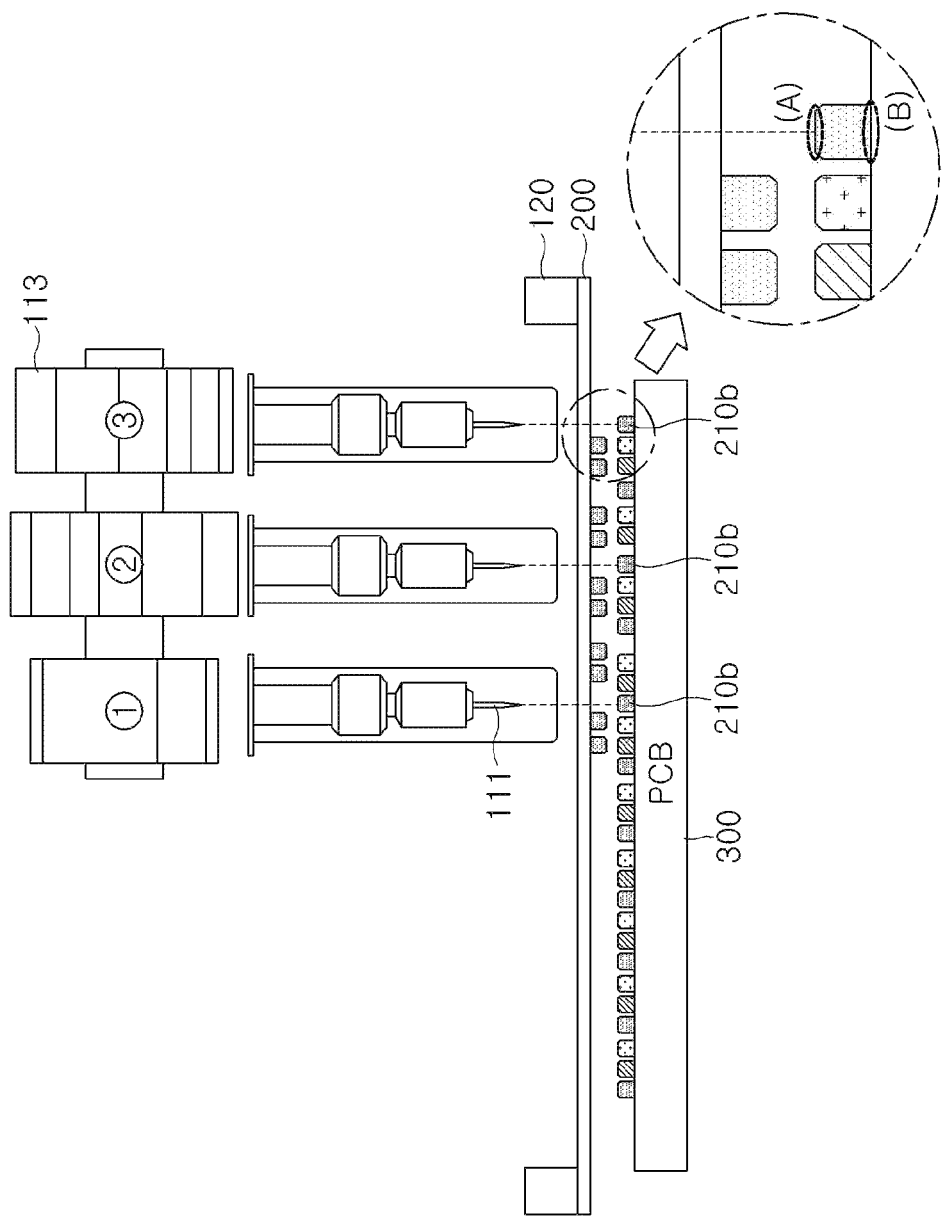
FIG. 5 is an exemplified view for explaining a process in which light-emitting diodes are transferred in the light-emitting diode module manufacturing apparatus according to the exemplary embodiment of the present invention.

More specifically, referring to FIG. 5, the multiple light-emitting diodes 210 may be arranged on the sheet 200 by being attached to the lower surface of the sheet 200. In this case, the light-emitting diode 210 has the other side surface, the light-emitting surface (A in FIG. 5) from which light is emitted, and one side surface, the electrode surface (B in FIG. 5) opposite to the light-emitting surface. Therefore, the light-emitting diode 210 may be arranged as the other side surface (A in FIG. 5) is attached to the sheet 200.

Further, the multiple ejection pins 111 of the multi-transfer unit 110 are operated to push the other side surface (A in FIG. 5) of each of the light-emitting diodes 210, such that the electrode positioned on the electrode surface (B in FIG. 5) of one side surface of each of the light-emitting diodes 210 is seated while coming into contact with the conductive pattern on the upper surface of the substrate 300.

In addition, at least one ejection point may be formed on the other side surface of each of the multiple light-emitting diodes 210 when the ejector pin 111 strikes the light-emitting diode to separate the light-emitting diode from the sheet 200.

Therefore, the light-emitting diode module manufacturing apparatus 100 according to the exemplary embodiment of the present invention may transfer the multiple light-emitting diodes 210 at a very high speed and may manufacture the light-emitting diode module by transferring the light-emitting diodes 210 to very accurate positions and in very accurate directions.

In addition, in the light-emitting diode module manufacturing apparatus 100 according to the exemplary embodiment of the present invention, the multiple ejection pins 111 of the multi-transfer unit 110 may be individually controlled by driving means 113. That is, as illustrated in FIG. 4, the multiple ejection pins 111 may be controlled by the multiple driving means 113 such as cams (A in FIG. 4) that operate individually. As a more specific example, as illustrated in FIG. 4, the multiple cams (①, ②, and ③ in FIG. 4) may be simultaneously operated to lower the multiple ejection pins 111 of the multi-transfer unit 110 and eject the multiple first light-emitting diodes 210. However, in a case in which the particular ejection pin 111 needs to be independently operated, such as a case in which the light-emitting diode 210 at the particular position is drawn due to an operational error or other causes, only the driving means 113 such as the particular cam corresponding to the particular position may be operated to lower only the particular ejection pin 111 and transfer the light-emitting diode 210 to the particular position.

Furthermore, FIG. 4 illustrates the example in which the driving means 113 are implemented by using the cams, but the present invention is not necessarily limited thereto, and any structure may be applied to the present invention without particular limitation as long as the structure may individually operate the multiple ejection pins 111.

In addition, as illustrated in FIG. 4, the multiple ejection pins 111 may be arranged at predetermined intervals. As a more specific example in the present invention, the light-emitting diode module may be a display module on which cells including red, green, and blue micro light-emitting diodes are arranged at predetermined intervals. In this case, the multiple ejection pins 111 may be arranged at the predetermined intervals between the cells or arranged at an interval which is a multiple of the predetermined interval.

More specifically, FIGS. 6A and 6B illustrate a structure in which the multiple ejection pins 111 of the multi-transfer unit 110 are arranged at an interval twice the interval between the cells. As illustrated in FIG. 6A, the multiple ejection pins 111 eject the multiple red light-emitting diodes 210a at the interval which is twice the interval between the cells to transfer the multiple red light-emitting diodes 210a to the substrate 300. Therefore, vacant spaces are formed between the respective multiple light-emitting diodes 210a. Therefore, as illustrated in FIG. 6B, the multiple ejection pins 111 may transfer the multiple red light-emitting diodes 210b to the substrate 300 by ejecting the multiple red light-emitting diodes 210b while corresponding to the vacant spaces, thereby effectively manufacturing the display module having the multiple light-emitting diodes 210.

Further, a second sheet on which second light-emitting diodes (e.g., green light-emitting diodes) 210 each having a wavelength different from a wavelength of the first light-emitting diode (e.g., red light-emitting diode) 210 are provided is aligned, and the multiple second light-emitting diodes 210 are transferred to the substrate 300 by the multi-transfer unit 110.

Further, in addition to the first light-emitting diode (e.g., red light-emitting diode) and the second light-emitting diode (e.g., green light-emitting diode), a third sheet on which third light-emitting diodes (e.g., blue light-emitting diodes) each having a wavelength different from the wavelength of the first light-emitting diode and the wavelength of the second light-emitting diode are provided is aligned, and the multiple third light-emitting diodes 210 are transferred to the substrate 300 by the multi-transfer unit 110, as a result of which it is possible to manufacture the display module having the structure in which the cells including the red, green, and blue light-emitting diodes are arranged.

Furthermore, because the processes of aligning and transferring the second light-emitting diodes and the third light-emitting diodes may be identical to the process of aligning and transferring the first light-emitting diodes, a repeated description thereof will be omitted.

In addition, FIG. 7 is a flowchart illustrating a light-emitting diode module manufacturing method according to an exemplary embodiment of the present invention.

As illustrated in FIG. 7, the light-emitting diode module manufacturing method according to the exemplary embodiment of the present invention is a method of manufacturing a light-emitting diode module including the multiple types of light-emitting diodes 210 each having one side surface from which the electrode surface is exposed, and the other side surface opposite to one side surface. The light-emitting diode module manufacturing method may include a sheet placement step S710 of disposing, at a predetermined position, the sheet 200 having the lower portion to which the other side surface of each of the multiple light-emitting diodes 210 is attached, a substrate placement step S720 of disposing, at a position below the sheet 200 and corresponding to the sheet 200, the substrate 300 having the conductive pattern with which one side surface of each of the multiple light-emitting diodes 210 electrically comes into contact, and a light-emitting diode transfer step S730 of transferring, to the substrate 300, the multiple light-emitting diodes 210 attached to the sheet 200, by using the multi-transfer unit 110 positioned above the sheet 200. In this case, in the light-emitting diode transfer step S730, the multi-transfer unit 110 has the multiple ejection pins 111 and pushes the multiple light-emitting diodes 210 on the sheet 200 by operating the multiple ejection pins 111 to transfer the multiple light-emitting diodes 210 to the substrate 300.

Because the light-emitting diode module manufacturing method according to the exemplary embodiment of the present invention can be easily understood with reference to the light-emitting diode module manufacturing apparatus 100 according to the exemplary embodiment of the present invention, the light-emitting diode module manufacturing method according to the exemplary embodiment of the present invention will be described below briefly by focusing on technical features thereof.

More specifically, in the present invention, the multiple light-emitting diodes 210 may be arranged at predetermined intervals on the sheet 200 and attached to the sheet 200. In particular, the multiple light-emitting diodes 210 may be arranged by being attached to the lower surface of the sheet 200. In this case, the other side surface of each of the multiple light-emitting diodes 210, from which light is emitted, is attached to the sheet 200, and the one or more electrodes such as first and second electrodes having different polarities are provided on the electrode surface of one side surface opposite to the other side surface, such that the ejection pin 111 may transfer the light-emitting diode by pushing the other side surface so that the one or more electrodes on one side surface electrically come into contact with the conductive pattern of the substrate 300.

In this case, more specifically, the multi-transfer unit 110 operates the multiple ejection pins 111 downward from above the sheet 200 and pushes the multiple light-emitting diodes 210 to simultaneously transfer the multiple light-emitting diodes 210 to the substrate 300.

In addition, at least one ejection point may be formed on the other side surface of each of the multiple light-emitting diodes 210 when the ejector pin 111 strikes the light-emitting diode to separate the light-emitting diode from the sheet 200.

Further, in the present invention, the multi-transfer unit 110 may operate only some of the multiple ejection pins 111, thereby transferring only some of the light-emitting diodes 210 to the substrate 300.

In addition, the multi-transfer unit 110 may transfer the multiple light-emitting diodes 210 to the substrate 300 so that an interval between the multiple light-emitting diodes 210 is equal to or a multiple of a pitch between the multiple light-emitting diodes 210 attached to the sheet 200.

Further, the light-emitting diode module may be a display module in which the cells including the red, green, and blue micro light-emitting diodes are arranged at predetermined intervals.

In this case, in the light-emitting diode transfer step S730, the multiple light-emitting diodes 210 are transferred by using the multiple ejection pins 111 arranged at the interval which is equal to or a multiple of the predetermined interval between the cells, as a result of which it is possible to more quickly and efficiently transfer the multiple light-emitting diodes 210 and manufacture the light-emitting diode module.

Further, in the light-emitting diode transfer step S730, two or more of the multiple ejection pins 111 are simultaneously operated, and thus the two or more light-emitting diodes 210 are simultaneously transferred to the substrate 300, as a result of which it is possible to more quickly and efficiently manufacture the light-emitting diode module.

In addition, in the sheet placement step S710, the sheet 200 may be aligned so that the light-emitting diodes 210 selected among the multiple light-emitting diodes 210 are moved to positions corresponding to the multiple ejection pins 111.

Further, the sheet alignment step S710 may include a first alignment step of aligning a first sheet 200 having the multiple first light-emitting diodes (e.g., red light-emitting diodes) 210, and a second alignment step of aligning a second sheet 200 having the multiple second light-emitting diodes (e.g., green light-emitting diodes) 210 each having a wavelength different from the wavelength of the first light-emitting diode 210. Further, the sheet alignment step S710 may also include a third alignment step of aligning a third sheet 200 having the third light-emitting diodes (e.g., blue light-emitting diodes) 210 having a wavelength different from the wavelength of the first light-emitting diode 210 and the wavelength of the second light-emitting diode 210.

In addition, in the light-emitting diode transfer step S730, the multiple first light-emitting diodes 210 may be transferred simultaneously to the multiple cells, and then the multiple second light-emitting diodes 210 may be transferred simultaneously to the multiple cells, and then the multiple third light-emitting diodes 210 may be transferred simultaneously, thereby manufacturing the display module including the red, green, and blue micro light-emitting diodes.

Further, the light-emitting diode module manufacturing apparatus 100 and the light-emitting diode module manufacturing method according to the exemplary embodiment of the present invention transfer the light-emitting diodes 210 from the sheet 200 to the substrate 300 by pushing the other side surface opposite to one side surface without striking the light-emitting diode, with the ejection pin 111, one side surface from which the electrode surface of the light-emitting diode 210 is exposed, as a result of which it is possible to effectively inhibit damage to the light-emitting diode 210 that may be caused during the transfer process.

Figure 8A:
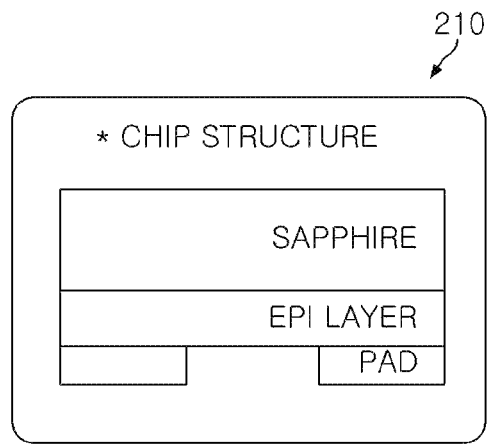
FIGS. 8A, 8B and 8C are views for explaining an operation of the ejection pin of the light-emitting diode module manufacturing apparatus according to the exemplary embodiment of the present invention.

In this regard, the operations of the ejection pins 111 of the light-emitting diode module manufacturing apparatus 100 according to the exemplary embodiment of the present invention will be described below in more detail with reference to FIGS. 8A, 8B and 8C. That is, as illustrated in FIG. 8A, the light-emitting diode 210 may have one side surface from which the electrode surface (pad) is exposed, and the other side surface opposite to one side surface.

Figure 8B:
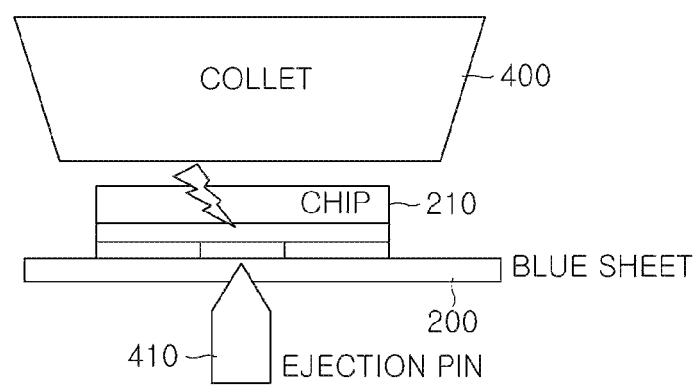

In this case, in the related art, as illustrated in FIG. 8B, a collet 400 positioned above the light-emitting diode 210 attracts the light-emitting diode 210, and an ejection pin 410 positioned below the light-emitting diode 210 ejects the light-emitting diode 210 in order to easily separate the light-emitting diode 210 from the sheet. However, in this case, there is a risk that an epitaxial layer positioned at a lower side of the light-emitting diode 210 will be damaged when the ejection pin 410 strikes the light-emitting diode.

Figure 8C:
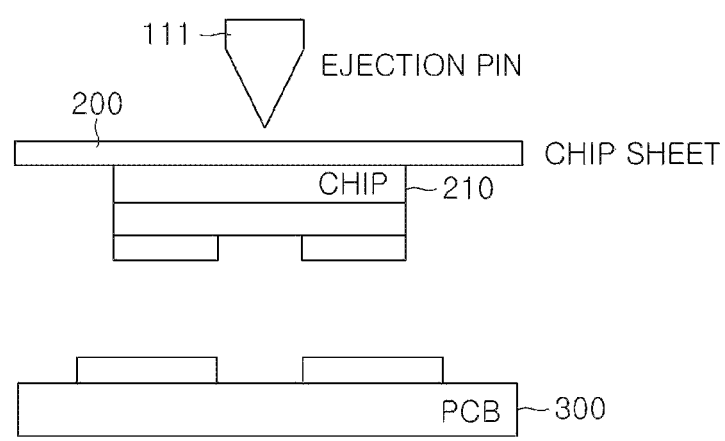

In contrast, as illustrated in FIG. 8C, according to the light-emitting diode module manufacturing apparatus 100 according to the exemplary embodiment of the present invention, the light-emitting diode 210 is transferred to the substrate 300 by ejecting the upper surface of the light-emitting diode 210, on which a sapphire substrate layer or the like is positioned, by using the ejection pin 111 positioned above the light-emitting diode 210, as a result of which it is possible to effectively inhibit damage to the epitaxial layer of the light-emitting diode 210 that may be caused during the process of transferring the light-emitting diode 210.

In addition, according to the light-emitting diode module manufacturing apparatus 100 and the light-emitting diode module manufacturing method according to the exemplary embodiment of the present invention, the process of accurately aligning the position of the sheet 200 and the position of the substrate 300 by using a sheet scanning unit 510 and a substrate scanning unit 520 is performed. Therefore, it is possible to transfer, to the exact position on the substrate 300, the light-emitting diode 210 attached to the sheet 200.

More specifically, as illustrated in FIG. 9A, according to the light-emitting diode module manufacturing apparatus 100 according to the exemplary embodiment of the present invention, the sheet scanning unit 510 capable of recognizing the position or the direction of the sheet 200 or the position or the direction of the light-emitting diode 210 by scanning the sheet 200 or the light-emitting diode 210 attached to the sheet 200 may include a camera or the like. In addition, as illustrated in FIG. 9B, the substrate scanning unit 520 capable of recognizing the position or the direction of the substrate by scanning the substrate 300 may be provided.

Therefore, according to the light-emitting diode module manufacturing apparatus 100 and the light-emitting diode module manufacturing method according to the exemplary embodiment of the present invention, the position and the direction of the sheet 200 or the position and the direction of the light-emitting diode 210 attached to the sheet 200 and the position and the direction of the substrate 300 are accurately aligned by using the sheet scanning unit 510 and the substrate scanning unit 520, as a result of which it is possible to transfer, to the exact position on the substrate 300, the light-emitting diode 210 attached to the sheet 200.

Further, according to the light-emitting diode module manufacturing apparatus 100 and the light-emitting diode module manufacturing method according to the exemplary embodiment of the present invention, the multi-transfer unit 110 has a sheet attraction unit 117 configured to attract the sheet, and the sheet attraction unit 117 attracts the sheet 200 after the ejection pins 111 push and transfer the light-emitting diodes 210 to the substrate 300, as a result of which it is possible to effectively separate the sheet 200 and the light-emitting diodes 210.

That is, this configuration will be described in more detail with reference to FIGS. 10A and 10B. First, as illustrated in FIG. 10A, in the light-emitting diode module manufacturing apparatus 100 according to the exemplary embodiment of the present invention, when the ejection pins 111 eject the light-emitting diodes 210 to transfer the light-emitting diodes 210 from the sheet 200 to the substrate 300, the light-emitting diodes 210 are attached to the substrate 300 by the downward movement of the ejection pins 111 as illustrated in (a) and (b) in FIG. 10A, and then the sheet 200 returns to the original position by being separated from the light-emitting diodes 210 by the upward movement of the ejection pin 111 as illustrated in (c) and (d) in FIG. 10A.

Figure 10B:
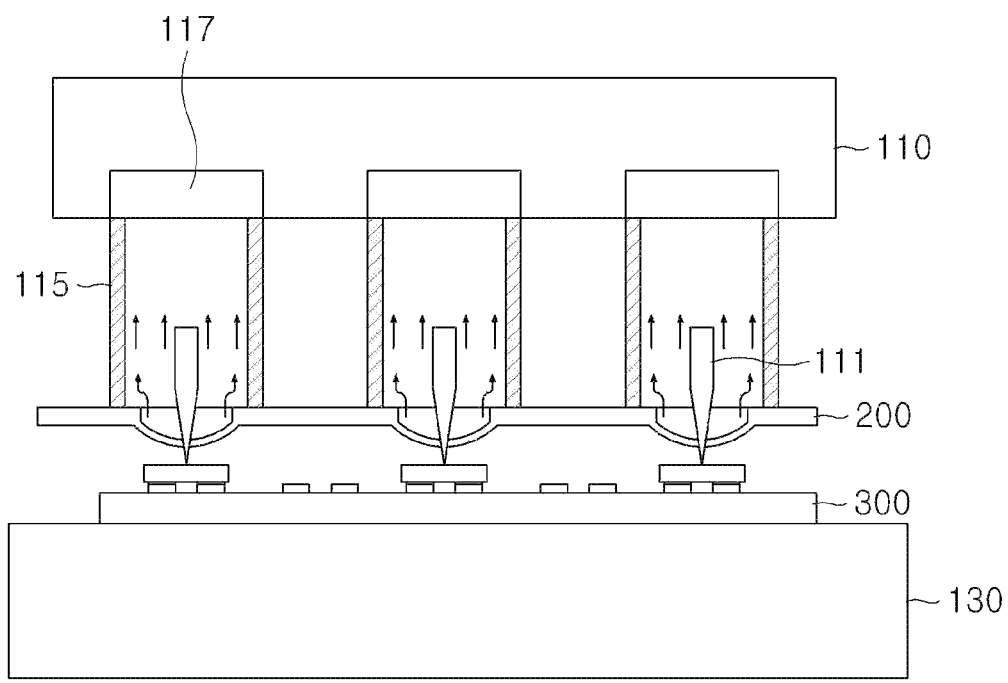

Because the light-emitting diodes 210 are arranged by being attached to the sheet 200, the sheet 200 cannot be smoothly separated due to bonding force between the light-emitting diodes 210 and the sheet 200 when the ejection pins 111 are raised as illustrated in (c) in FIG. 10B. Further, the light-emitting diodes 210 may deviate from the predetermined positions on the substrate 300, or the positions or the directions of the light-emitting diodes 210 may be misaligned.

In contrast, according to the light-emitting diode module manufacturing apparatus 100 and the light-emitting diode module manufacturing method according to the exemplary embodiment of the present invention, the multi-transfer unit 110 has the sheet attraction unit 117 configured to attract the sheet as illustrated in FIG. 10B, and the sheet attraction unit 117 attracts the sheet 200 after the ejection pins 111 push and transfer the light-emitting diodes 210 to the substrate 300, as a result of which it is possible to effectively separate the sheet 200 and the light-emitting diodes 210. More specifically, the sheet attraction unit 117 may be implemented to attract the sheet 200 by eliminating air in an ejection cover 115 by using a vacuum device or the like.

Further, in the state in which the ejection pins 111 push the light-emitting diodes 210, the sheet attraction unit 117 is operated to separate the sheet 200 from the light-emitting diodes 210 first, and then the ejection pins 111 are raised. Therefore, it is possible to prevent the positions and the directions of the light-emitting diodes 210 from being misaligned by the bonding force during the process of separating the sheet 200 and the light-emitting diodes 210, and thus it is possible to better transfer the light-emitting diodes 210 to an exact position and in an exact direction.

In addition, according to the light-emitting diode module manufacturing apparatus 100 and the light-emitting diode module manufacturing method according to the exemplary embodiment of the present invention, the multi-transfer unit 110 has a pressure adjustment unit 119 capable of adjusting a pressure applied to the light-emitting diode 210 from the ejection pin 111. Therefore, it is possible to prevent an excessive pressure from being applied to the light-emitting diode 210 from the ejection pin 111 when the ejection pin 111 pushes and transfers the light-emitting diode 210 to the substrate 300.

Figure 11A:
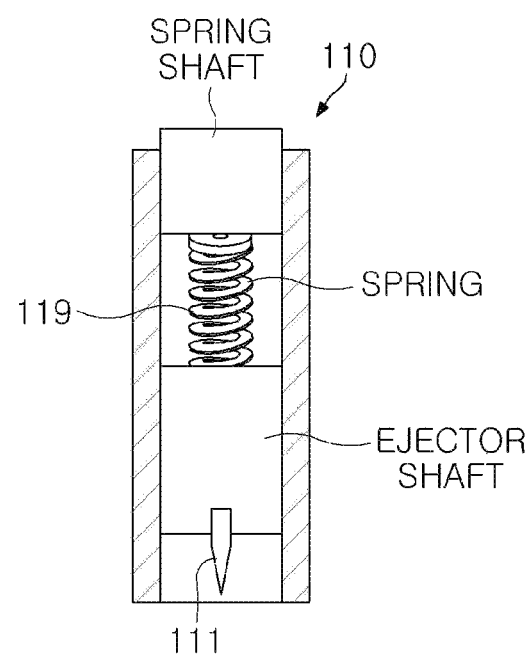
FIGS. 11A, 11B and 11C are views for explaining a structure of the multi-transfer unit having a pressure adjustment unit of the light-emitting diode module manufacturing apparatus according to the exemplary embodiment of the present invention.
Figure 11B:
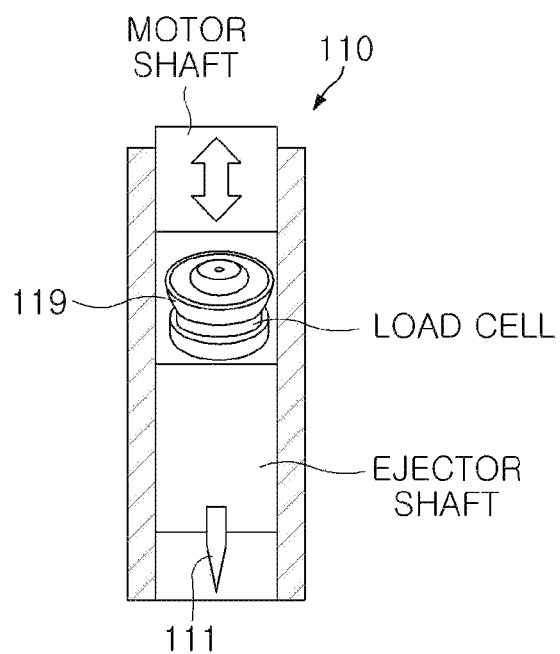
Figure 11C:
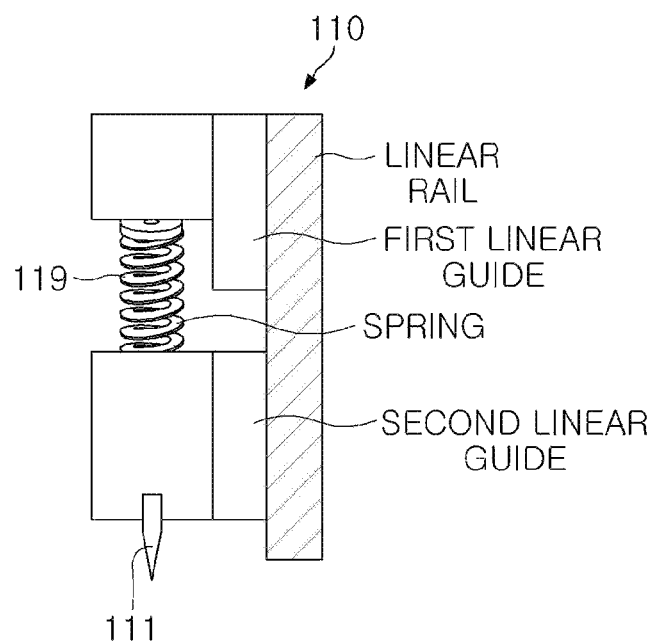

That is, as illustrated in FIGS. 11A, 11B and 11C, the light-emitting diode module manufacturing apparatus 100 according to the exemplary embodiment of the present invention has the pressure adjustment unit 119 implemented by a spring or a load cell, as a result of which it is possible to adjust the pressure to be applied to the light-emitting diode 210 from the ejection pin 111.

More specifically, as illustrated in FIG. 11A, a structure such as a spring having elasticity is provided on the ejection pin 111, as a result of which it is possible to prevent an excessive pressure from being applied to the light-emitting diode 210 from the ejection pin 111. Further, the spring may mitigate impact instantaneously applied to the light-emitting diode 210 as the ejection pin 111 strikes the light-emitting diode 210, thereby preventing damage to the light-emitting diode 210.

In addition, as illustrated in FIG. 11B, a component such as a load cell capable of measuring a pressure applied to the ejection pin 111 is provided to control the pressure so that the pressure does not exceed a predetermined reference value, thereby preventing damage to the light-emitting diode 210.

Further, as illustrated in FIG. 11C, a rail and a guide structure are provided so that the ejection pin 111 may be linearly moved. The pressure adjustment unit 119 such as the spring or the load cell may be provided on the ejection pin 111 in order to adjust the pressure to be applied to the light-emitting diode 210 from the ejection pin 111.

MODE FOR INVENTION

Figure 12:
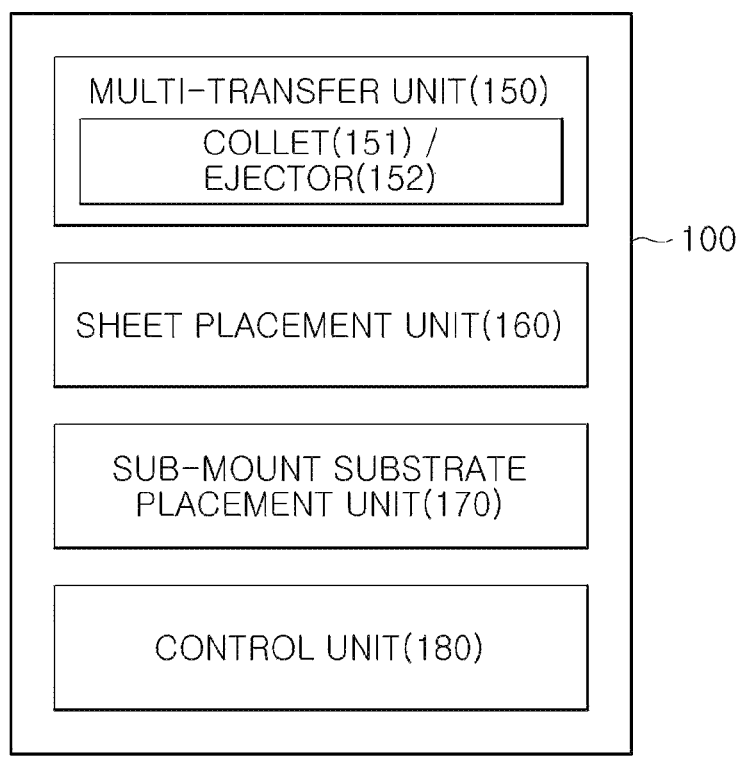
FIG. 12 is a configuration view of the light-emitting diode module manufacturing apparatus according to the exemplary embodiment of the present invention.

In addition, FIG. 12 is a configuration view illustrating the light-emitting diode module manufacturing apparatus according to the exemplary embodiment of the present invention. As illustrated in FIG. 12, the light-emitting diode module manufacturing apparatus 100 according to the exemplary embodiment of the present invention is an apparatus for manufacturing a light-emitting diode module including the multiple light-emitting diodes 210 each having one side surface from which an electrode surface is exposed, and the other side surface opposite to one side surface. The light-emitting diode module manufacturing apparatus 100 may include a multi-transfer unit 150, a sheet placement unit 160, a sub-mount substrate placement unit 170, and a control unit 180.

First, the sheet placement unit 160 disposes, at a predetermined position, the sheet 200 having the upper portion to which one side surface of each of the multiple light-emitting diodes is attached. Further, the sheet placement unit 160 may include a structure for accurately aligning the sheet 200 at the predetermined position.

In addition, the sub-mount substrate placement unit 170 disposes a sub-mount substrate 310 at a predetermined position, and the sub-mount substrate 310 has a conductive pattern with which one side surface of each of the multiple light-emitting diodes 210 electrically comes into contact. Further, the sub-mount substrate placement unit 170 may also have a structure for accurately aligning the sub-mount substrate 310 at the predetermined position.

Therefore, the multi-transfer unit 150 uses multiple collets 151 to separate the multiple light-emitting diodes 210 from the sheet 200 and move the multiple light-emitting diodes 210 to the sub-mount substrate 310. In this case, the multiple collets 151 attract the other side surface of each of the light-emitting diodes 210 and move and transfer the light-emitting diodes 210 to the sub-mount substrate 310.

In addition, the light-emitting diode module manufacturing apparatus 100 according to the exemplary embodiment of the present invention may include the control unit 180 that uses a microprocessor or the like and controls the operations of the multi-transfer unit 150, the sheet placement unit 160, and the sub-mount substrate placement unit 170.

Further, in the light-emitting diode module manufacturing apparatus 100 according to the exemplary embodiment of the present invention, the multi-transfer unit 150 may further include multiple ejection pins 152 corresponding to the multiple collets 151. The multiple ejection pins 152 strike one side surface of each of the multiple light-emitting diodes 210 attached to the sheet 200 to separate the multiple light-emitting diodes 210 from the sheet 200, and then may transfer the multiple light-emitting diodes 210 to the sub-mount substrate 310.

In this case, the multiple ejection pins 152 may separate the multiple light-emitting diodes 210 from the sheet 200 by striking one side surface of each of the multiple light-emitting diodes 210 while the multiple collets 151 attract the multiple light-emitting diodes 210. The multiple ejection pins 152 may separate the multiple light-emitting diodes 210 from the sheet 200 by striking one side surface of each of the multiple light-emitting diodes 210 after the multiple collets 151 attract the multiple light-emitting diodes 210.

Therefore, in the present invention, each of the multiple light-emitting diodes 210 may be the light-emitting diode 210 including at least one edge finger on one side surface thereof.

In addition, at least one ejection point may be formed on one side surface of each of the multiple light-emitting diodes 210 when the ejector pin 152 strikes the light-emitting diode to separate the light-emitting diode from the sheet 200.

In addition, in the light-emitting diode module manufacturing apparatus 100 according to the exemplary embodiment of the present invention, the light-emitting diode module may be a display module in which the cells including the red, green, and blue micro light-emitting diodes 210 are arranged at predetermined intervals.

Therefore, the multi-transfer unit 150 simultaneously transfers the multiple first light-emitting diodes (e.g., red LED chips) 210 from the first sheet 200 to the sub-mount substrate 310, and then simultaneously transfers the multiple second light-emitting diodes (e.g., green LED chips) 210 from the second sheet 200 to the sub-mount substrate 310. Of course, subsequently, the multi-transfer unit 150 may simultaneously transfer the multiple third light-emitting diodes (e.g., blue LED chips) 210 from the third sheet 200 to the sub-mount substrate 310, thereby manufacturing the display module.

In this case, the multi-transfer unit 150 includes the multiple collets 151 arranged at an interval which is equal to or a multiple of the predetermined interval between the cells, as a result of which it is possible to more quickly and efficiently transfer the multiple light-emitting diodes 210 corresponding to the respective cells.

Further, the sheet placement unit 160 may include a structure configured to align, at particular positions, the first and second sheets having the multiple light-emitting diode chips 210. More specifically, the sheet placement unit 160 may include a first placement unit (not illustrated) configured to align, at a particular position, the first sheet having the first light-emitting diode chips (e.g., red LED chips), and a second placement unit (not illustrated) configured to align, at a particular position, the second sheet having the second light-emitting diode chips (e.g., green LED chips) each having a wavelength different from a wavelength of the first light-emitting diode chip.

In this case, with the method of simultaneously transferring the multiple first light-emitting diodes to the multiple cells and then simultaneously transferring the multiple second light-emitting diodes to the multiple cells, the multi-transfer unit 150 may sequentially transfer various types of light-emitting diodes, thereby manufacturing the light-emitting diode module.

In order to cope with the increase in bonding time and the increase in deviation in bonding position and bonding direction of the multiple light-emitting diodes 210, which may be caused at the time of manufacturing a light-emitting diode module by bonding the multiple light-emitting diodes 210 such as manufacturing a module including the multiple light-emitting diodes 210 such as the red, green, and blue light-emitting diodes or manufacturing a display module by arranging the multiple micro light-emitting diodes 210, there are provided the light-emitting diode module manufacturing apparatus and the light-emitting diode module manufacturing method. The light-emitting diode module manufacturing apparatus 100 according to the exemplary embodiment of the present invention uses the multi-transfer unit 150 including the multiple collets 151 and simultaneously transfers, to the sub-mount substrate 310, the multiple light-emitting diodes 210 arranged on the sheet 200, thereby manufacturing the light-emitting diode module. As a result, it is possible to improve a speed of bonding the multiple light-emitting diodes 210 and to minimize a deviation in position and direction of the bonded multiple light-emitting diodes 210.

Hereinafter, the light-emitting diode module manufacturing apparatus according to the exemplary embodiment of the present invention will be described in detail with reference to the respective drawings.

Figure 13:
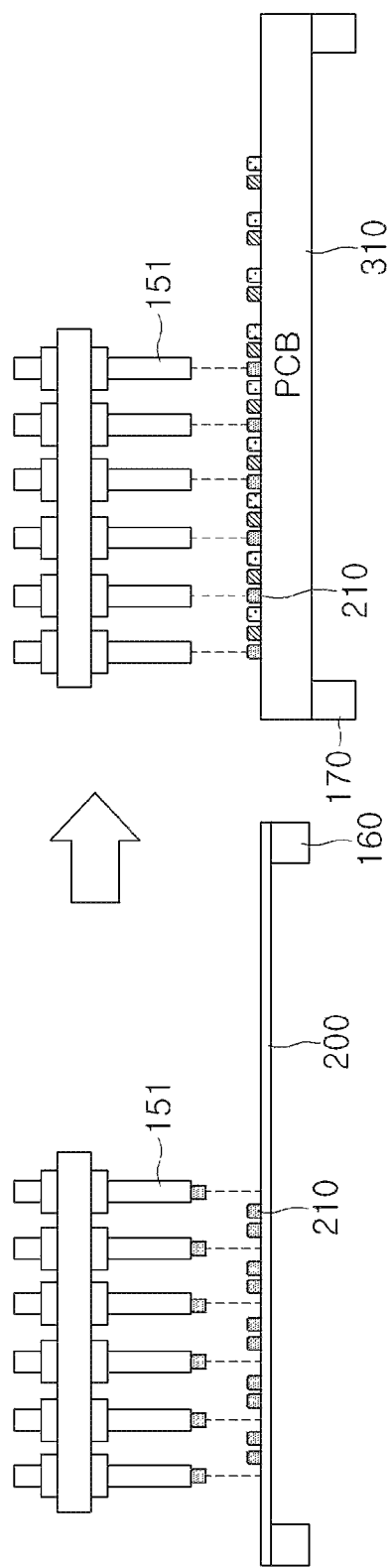
FIG. 13 is an exemplified view for explaining operations of multiple collets of the light-emitting diode module manufacturing apparatus according to the exemplary embodiment of the present invention.

FIG. 13 illustrates the operation of the light-emitting diode module manufacturing apparatus 100 using the multi-transfer unit 150 having the multiple collets 151 according to the exemplary embodiment of the present invention. As illustrated in FIG. 13, in the present invention, the sheet 200 having the multiple light-emitting diodes 210 is positioned below the multi-transfer unit 150 having the multiple collets 151. The multi-transfer unit 150 attracts the multiple first light-emitting diodes (e.g., red light-emitting diodes) 210 from the sheet 200, and then the multi-transfer unit 150 moves to a position above the sub-mount substrate 310, and then seats the attracted multiple first light-emitting diodes 210 on the sub-mount substrate 310 (FIG. 13).

In addition, the multiple first light-emitting diodes 210 may be arranged such that one side surface of each of the multiple first light-emitting diodes 210 is attached to the sheet 200. In addition, various structures having the multiple first light-emitting diodes 210, such as a strip to which the multiple first light-emitting diodes 210 are transferred, may be provided so that the multiple first light-emitting diodes 210 may be transferred to the sub-mount substrate 310 by the collets 151.

In this case, the multi-transfer unit 150, the sheet 200, and the sub-mount substrate 310 may be aligned by using a recognition means such as a camera, such that the first light-emitting diodes 210 arranged on the sheet 200, the collets 151 configured to attract the first light-emitting diodes 210, and the conductive pattern of the sub-mount substrate 310 on which the first light-emitting diodes 210 are to be seated may be accurately aligned at positions and in directions corresponding to one another.

Further, as illustrated in FIG. 13, the multi-transfer unit 150 moves to a position corresponding to the sub-mount substrate 310 and transfers, to the sub-mount substrate 310, the multiple first light-emitting diodes 210 attracted from the sheet 200.

Figure 14:
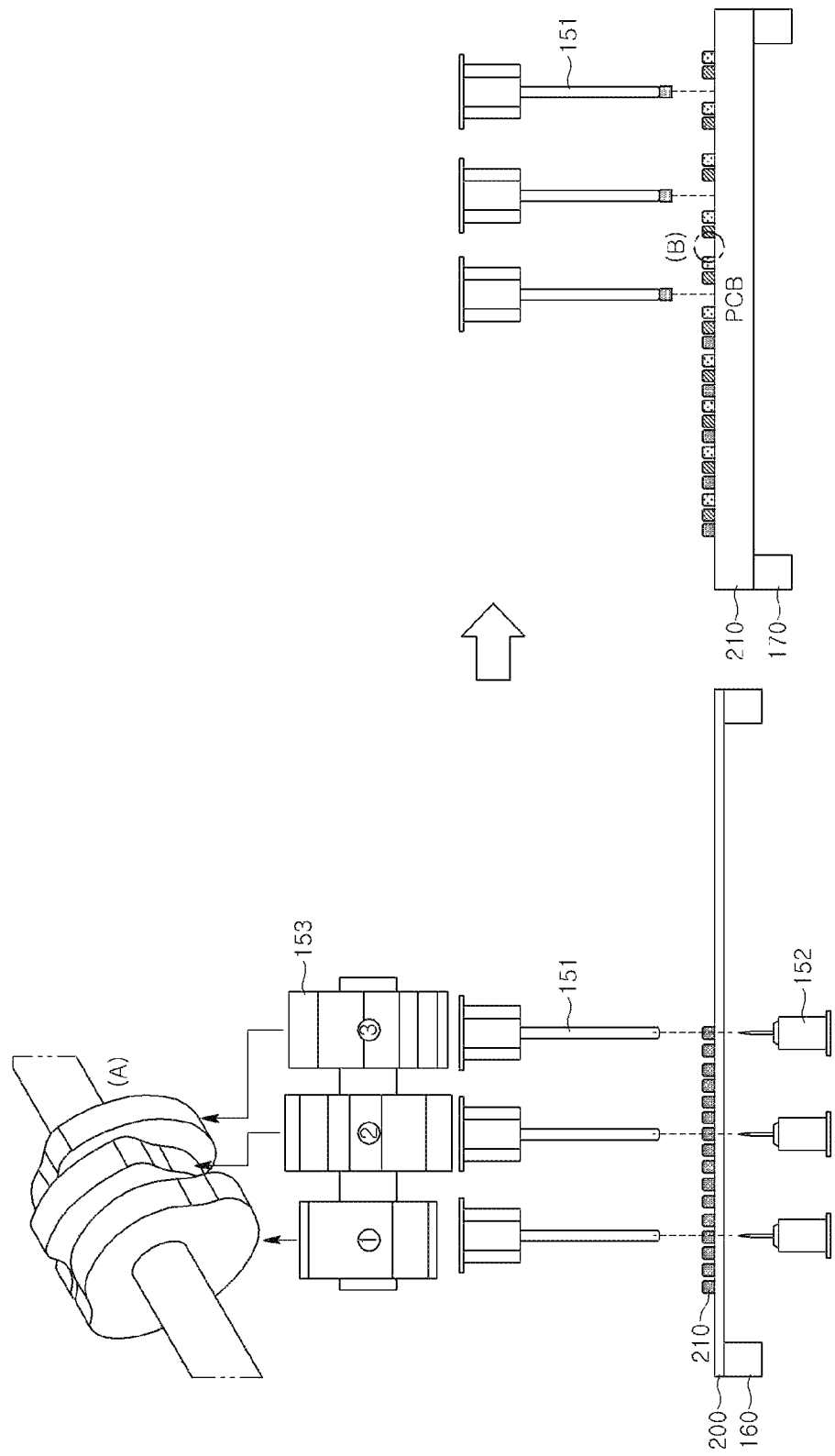
FIGS. 14 and 15 are exemplified views for explaining a process of transferring light-emitting diode chips by using the multiple collets of the light-emitting diode module manufacturing apparatus according to the exemplary embodiment of the present invention.

More specifically, the operation of the multi-transfer unit 150 having the multiple collets 151 according to the exemplary embodiment of the present invention will be described below with reference to FIG. 14. As illustrated in FIG. 14, in the exemplary embodiment of the present invention, the multi-transfer unit 150 having the multiple collets 151 is positioned above the sheet 200 on which the first light-emitting diodes 210 are arranged, and the multiple ejection pins 152 corresponding to the multiple collets 151 are positioned below the sheet 200. In this case, the sheet 200 may be moved or rotated by the sheet placement unit 160 so as to be aligned in position and direction with the multi-transfer unit 150 including the multiple collets 151 and the multiple ejection pins 152.

Further, the multiple collets 151 attract and pick up the multiple first light-emitting diodes 210 from the sheet 200 and then move to the positions corresponding to the sub-mount substrate 310 to transfer the multiple first light-emitting diodes (e.g., red light-emitting diodes) 210 to the sub-mount substrate 310.

In addition, the multiple collets 151 and the multiple ejection pins 152 may be individually controlled by the multiple driving means 153. For example, as illustrated in FIG. 14, the operations such as the upward and downward movements of the multiple collets 151 may be controlled by the multiple driving means 153 such as cams (A in FIG. 14) that operate individually. As a more specific example, as illustrated in FIG. 14, the multiple cams (①, ②, and ③ in FIG. 14) may be simultaneously operated to lower the multiple collets 151 and pick up the multiple first light-emitting diodes 210. However, in a case in which the particular collet 151 needs to be independently operated, such as a case in which the first light-emitting diode 210 at the particular position is drawn due to an operational error or other causes, only the driving means 153 such as the particular cam corresponding to the particular collet 151 may be operated to lower only the particular collet 151 and transfer only the particular first light-emitting diode 210.

Furthermore, FIG. 14 illustrates the example in which the driving means 153 are implemented by using the cams, but the present invention is not necessarily limited thereto, and any structure may be applied to the present invention as long as the structure may individually operate the multiple collets 151. In addition, an air pump configured to attract the first light-emitting diodes 210 may be provided.

In addition, as illustrated in FIG. 14, the multiple collets 151 may be arranged at predetermined intervals. In particular, in the present invention, the light-emitting diode module may be a display module on which cells including red, green, and blue micro light-emitting diodes are arranged at predetermined intervals. In this case, the multiple collets 151 may be arranged at the predetermined intervals or arranged at an interval which is a multiple of the predetermined interval.

More specifically, a case in which the multiple collets 151 are arranged at an interval which is twice the interval between the cells will be described as an example with reference to FIGS. 14 and 15. Therefore, as illustrated in FIG. 14, the multiple collets 151 pick up the multiple first light-emitting diodes (e.g., red light-emitting diodes) 210 at the interval which is twice the interval between the cells and transfer the multiple first light-emitting diodes to the sub-mount substrate 310. Therefore, vacant spaces (B in FIG. 14), where there is no first light-emitting diode 210, are formed in spaces between the collets 151 and on the sub-mount substrate 310.

Figure 15:
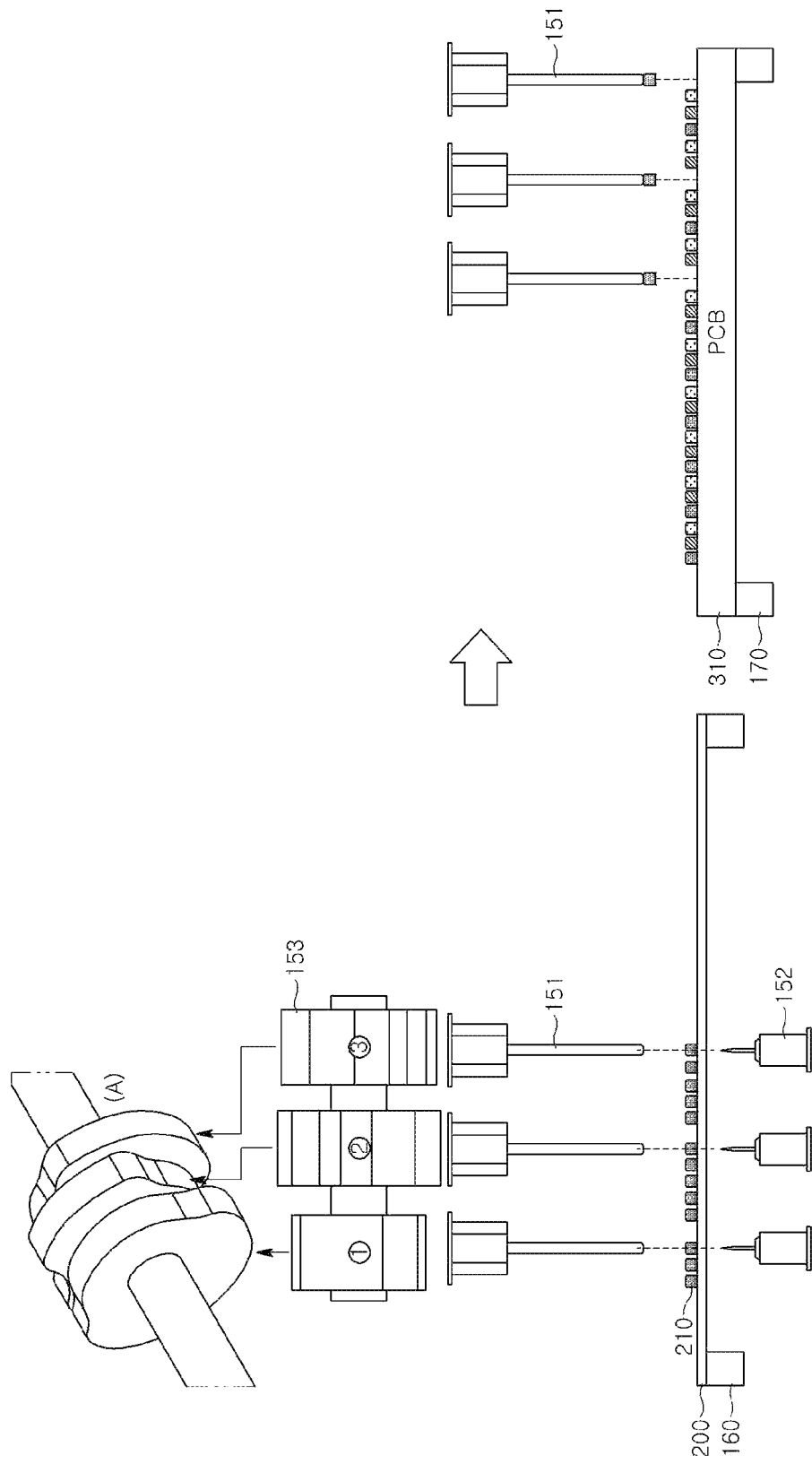

Therefore, as illustrated in FIG. 15, the multiple collets 151 pick up the multiple first light-emitting diodes 210 corresponding to the vacant space and transfer the multiple first light-emitting diodes 210 to the sub-mount substrate 310, as a result of which it is possible to quickly and efficiently manufacture the display module having the multiple light-emitting diodes 210.

Further, the light-emitting diode module manufacturing apparatus 100 according to the exemplary embodiment of the present invention prepares the second sheet 200 on which the second light-emitting diodes (e.g., green light-emitting diodes) 210 each having the wavelength different from the wavelength of the completely transferred first light-emitting diodes (e.g., red light-emitting diodes) 210 are arranged. The light-emitting diode module manufacturing apparatus 100 transfers the multiple second light-emitting diodes 210 to the sub-mount substrate 310 by using the multi-transfer unit 150.

Further, in addition to the first light-emitting diode (e.g., red light-emitting diode) 210 and the second light-emitting diode (e.g., green light-emitting diode) 210, the third sheet on which the third light-emitting diodes (e.g., blue light-emitting diodes) each having the wavelength different from the wavelength of the first light-emitting diode and the wavelength of the second light-emitting diode are provided is aligned, and the multiple third light-emitting diodes 210 are simultaneously transferred to the sub-mount substrate 310 by the multi-transfer unit 150, as a result of which it is possible to manufacture the display module having the structure in which the cells including the red, green, and blue light-emitting diodes 210 are arranged.

Furthermore, because the processes of aligning and transferring the second light-emitting diodes 210 and the third light-emitting diodes 210 may be identical to the process of aligning and transferring the first light-emitting diodes 210, a repeated description thereof will be omitted.

Figure 16:
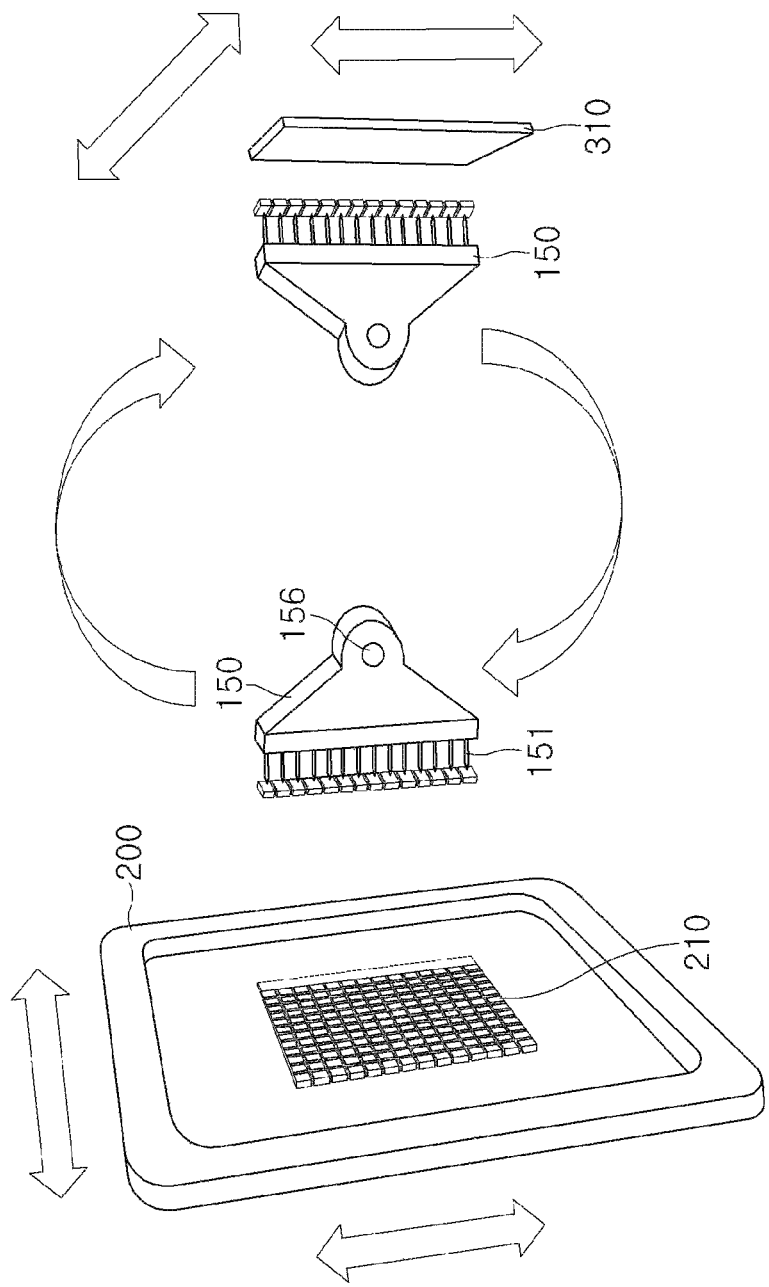
FIG. 16 is a view for explaining an operation of the light-emitting diode module manufacturing apparatus using the multiple collets according to the exemplary embodiment of the present invention.

Further, as illustrated in FIG. 16, the multi-transfer unit 150 according to the exemplary embodiment of the present invention may have a rotation unit 156 capable of rotating the multiple collets 151. Therefore, the multi-transfer unit 150 is structured to face the first sheet 200 and the sub-mount substrate 310 by being rotated. In a state in which the multi-transfer unit 150 is rotated at a first angle to face the first sheet 200, the multi-transfer unit 150 may simultaneously attract the multiple first light-emitting diodes 210. In a state in which the multi-transfer unit 150 is rotated at a second angle to face the sub-mount substrate 310, the multi-transfer unit 150 may simultaneously transfer the multiple first light-emitting diodes 210 to the sub-mount substrate 310.

Therefore, the multi-transfer unit 150 according to the exemplary embodiment of the present invention may more quickly and accurately transfer the multiple light-emitting diodes 210 from the first sheet 200 to the sub-mount substrate 310 while adjusting the direction of the multi-transfer unit 150 by means of the rotational operation.

In addition, as illustrated in FIG. 16, the first sheet 200 such as a wafer and the sub-mount substrate 310 may be aligned by being rotated or moved in vertical and horizontal directions (x-axis and y-axis directions). More specifically, the position and the direction of the first sheet 200 or the sub-mount substrate 310 may be recognized by using a camera or the like, and the position and the direction of the first sheet 200 or the sub-mount substrate 310 may be aligned with the position and the direction corresponding to the multi-transfer unit 150.

Figure 17A:
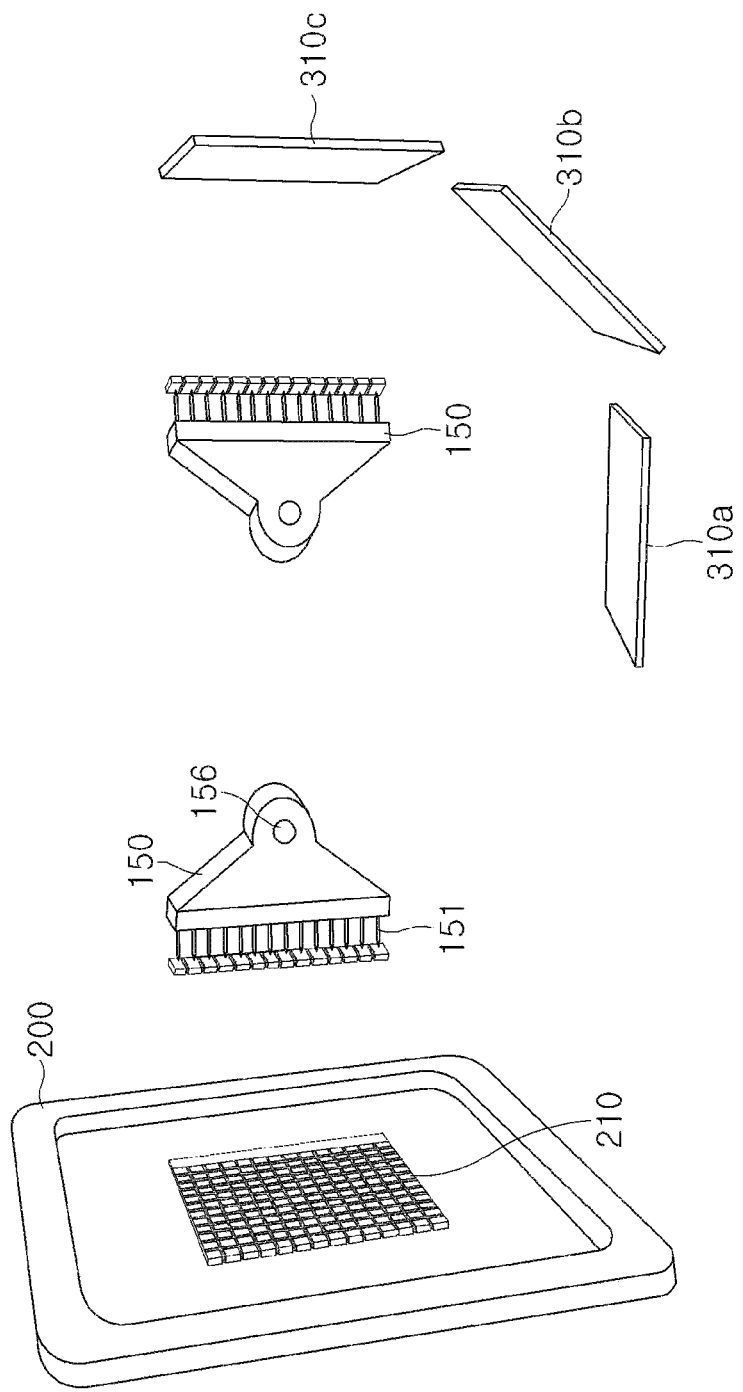
FIGS. 17A and 17B are views illustrating various exemplary embodiments of the light-emitting diode module manufacturing apparatus using the multiple collets according to the exemplary embodiment of the present invention.

More specifically, FIG. 17A illustrates that the first light-emitting diodes 210 are quickly and accurately transferred to the multiple sub-mount substrates 310 by using the rotational operation of the multi-transfer unit 150 in the exemplary embodiment of the present invention.

As illustrated in FIG. 17A, the multi-transfer unit 150 according to the exemplary embodiment of the present invention attracts the multiple first light-emitting diodes 210 (e.g., red light-emitting diodes) 210 in the state in which the multi-transfer unit 150 is rotated at the first angle to face the first sheet 200. The multi-transfer unit 150 divides the multiple first light-emitting diodes 210 attracted from the sheet 200 into three groups and sequentially transfers the multiple first light-emitting diodes 210 to the respective sub-mount substrates 310a, 310b, and 310c while rotating at the second angle to face the first sub-mount substrate 310a, rotating at a third angle to face the second sub-mount substrate 310b, and rotating at a fourth angle to face the third sub-mount substrate 310c. As a result, it is possible to more quickly and accurately transfer the multiple light-emitting diodes 210 to the multiple sub-mount substrates 310.

Figure 17B:
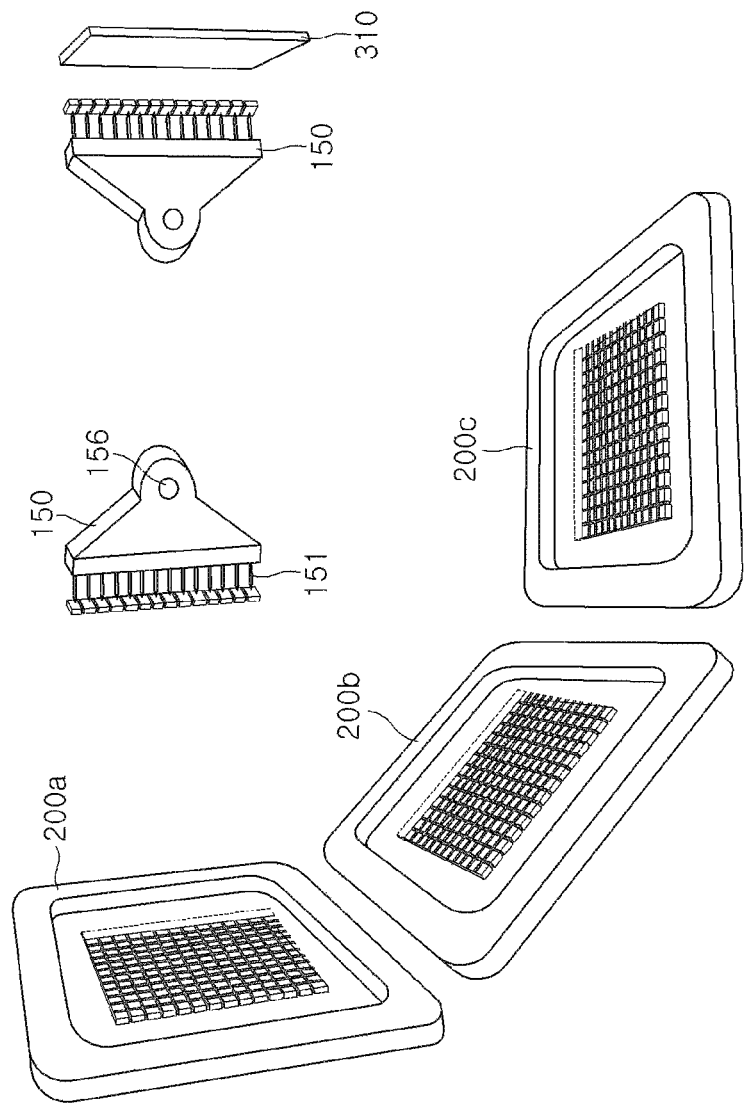

Further, as illustrated in FIG. 17B, the first sheet 200a, the second sheet 200b, and the third sheet 200c, which have the multiple light-emitting diodes 210 including the red, green, and blue light-emitting diodes, respectively, are disposed at the first angle, the second angle, and the third angle. The multi-transfer unit 150 according to the exemplary embodiment of the present invention is rotated at the first angle and attracts the multiple red light-emitting diodes 210, and then transfers the multiple red light-emitting diodes 210 to the sub-mount substrate 310. Next, the multi-transfer unit 150 attracts the multiple green and blue light-emitting diodes 210 and sequentially transfers the multiple green and blue light-emitting diodes 210 to the sub-mount substrates 310 while rotating at the second angle and the third angle. As a result, it is possible to more quickly and accurately manufacture the light-emitting diode module such as a display module having the multiple red, green, and blue light-emitting diodes 210.

Lastly, FIG. 18 is a flowchart illustrating the light-emitting diode module manufacturing method according to the exemplary embodiment of the present invention.

As illustrated in FIG. 18, the light-emitting diode module manufacturing method according to the exemplary embodiment of the present invention is a method of manufacturing a light-emitting diode module including the multiple types of light-emitting diodes 210 each having one side surface from which the electrode surface is exposed, and the other side surface opposite to one side surface. The light-emitting diode module manufacturing method may include a sheet placement step S810 of disposing the sheet having the upper portion to which one side surface of each of the multiple light-emitting diodes 210 is attached, a sub-mount substrate placement step S820 of disposing the sub-mount substrate 310 having the conductive pattern with which one side surface of each of the multiple light-emitting diodes 210 electrically comes into contact, and a light-emitting diode transfer step S830 of transferring the multiple light-emitting diodes 210 from the sheet 200 to the sub-mount substrate 310 so that one side surface of each of the multiple light-emitting diodes 210 electrically comes into contact with the conductive pattern of the sub-mount substrate 310. In this case, in the light-emitting diode transfer step S830, the multiple collets 151 attract the other side surface of each of the multiple light-emitting diodes 210 on the sheet 200, and the multiple ejection pins 152 corresponding to the multiple collets 151 strike one side surface of each of the multiple light-emitting diodes 210 to separate the multiple light-emitting diodes 210 from the sheet 200.

Because the light-emitting diode module manufacturing method according to the exemplary embodiment of the present invention can be easily understood with reference to the light-emitting diode module manufacturing apparatus 100 according to the exemplary embodiment of the present invention, the light-emitting diode module manufacturing method according to the exemplary embodiment of the present invention will be described below briefly by focusing on technical features thereof.

More specifically, the multiple light-emitting diodes 210 may be arranged at predetermined intervals on the sheet 200 and attached to the sheet 200. In this case, the first and second electrodes having different polarities may be provided on one side surface of each of the multiple light-emitting diodes 210, and the first and second electrodes may be attached and fixed to the sheet 200. Further, at least one edge finger may be provided on the other side surface of each of the multiple light-emitting diodes 210.

In addition, at least one ejection point may be formed on one side surface of each of the multiple light-emitting diodes 210 when the ejector pin 152 strikes the light-emitting diode to separate the light-emitting diode from the sheet 200.

In addition, all of the multiple light-emitting diodes 210 moved to the sub-mount substrate 310 may have the same height based on the sub-mount substrate 310.

Further, the light-emitting diode module may be a display module in which the cells including the red, green, and blue micro light-emitting diodes are arranged at predetermined intervals.

In this case, in the light-emitting diode transfer step S830, the multiple light-emitting diodes are transferred by using the multiple collets 151 arranged at the interval which is equal to or a multiple of the predetermined interval, as a result of which it is possible to more quickly and efficiently transfer the multiple light-emitting diodes 210 and manufacture the light-emitting diode module.

Further, in the light-emitting diode transfer step S830, two or more of the multiple collets 151 are simultaneously operated, and thus the two or more light-emitting diodes 210 are simultaneously transferred to the sub-mount substrate 310, as a result of which it is possible to more quickly and efficiently manufacture the light-emitting diode module.

In addition, the sheet placement step S810 may include a process of aligning the sheet 200 so that the light-emitting diodes 210 selected among the multiple light-emitting diodes 210 are moved to positions corresponding to the multiple collets 151.

Further, the sheet placement step S810 may include a first alignment step of aligning a first sheet 200 having the multiple first light-emitting diodes (e.g., red light-emitting diodes) 210, and a second alignment step of aligning a second sheet 200 having the multiple second light-emitting diodes (e.g., green light-emitting diodes) 210 each having a wavelength different from the wavelength of the first light-emitting diode 210. Further, the sheet alignment step S810 may also include a third alignment step of aligning a third sheet 200 having the third light-emitting diodes (e.g., blue light-emitting diodes) 210 having a wavelength different from the wavelength of the first light-emitting diode 210 and the wavelength of the second light-emitting diode 210.

In this case, in the light-emitting diode transfer step S830, the multiple first light-emitting diodes 210 may be transferred simultaneously to the multiple cells, and then the multiple second light-emitting diodes 210 may be transferred simultaneously to the multiple cells, and then the multiple third light-emitting diodes 210 may be transferred simultaneously, thereby manufacturing the display module including the red, green, and blue micro light-emitting diodes.

Further, in the light-emitting diode transfer step S830, the multi-transfer unit 150 is structured to face the sheet 200 and the sub-mount substrate 310 by being rotated. In the state in which the multi-transfer unit 150 is rotated at the first angle to face the sheet 200, the multi-transfer unit 150 simultaneously attracts the multiple light-emitting diodes 210. In the state in which the multi-transfer unit 150 is rotated at the second angle to face the sub-mount substrate 310, the multi-transfer unit 150 simultaneously transfers the multiple light-emitting diodes 210 to the sub-mount substrate 310. As a result, it is possible to more quickly and accurately transfer the multiple light-emitting diodes 210 from the sheet 200 to the sub-mount substrate 310.

The above description is simply given for illustratively describing the technical spirit of the present invention, and those skilled in the art to which the present invention pertains will appreciate that various modifications, changes, and substitutions are possible without departing from the essential characteristic of the present invention. Accordingly, the exemplary embodiments disclosed in the present invention and the accompanying drawings are intended not to limit but to describe the technical spirit of the present invention, and the scope of the technical spirit of the present invention is not limited by the exemplary embodiments and the accompanying drawings. The protective scope of the present invention should be construed based on the following claims, and all the technical spirit in the equivalent scope thereto should be construed as falling within the scope of the present invention.

The invention claimed is:

1. An apparatus for manufacturing a light-emitting diode module comprising multiple light-emitting diodes each having one side surface from which an electrode surface is exposed, and the other side surface opposite to one side surface, the apparatus comprising:
   a sheet placement unit configured to dispose a sheet having a lower portion to which the other side surface of each of the multiple light-emitting diodes is attached;
   a substrate placement unit configured to dispose, at a position below the sheet and corresponding to the sheet, a substrate having a conductive pattern with which one side surface of each of the multiple light-emitting diodes electrically comes into contact; and
   a multi-transfer unit having multiple ejection pins configured to transfer, to the substrate, the multiple light-emitting diodes attached to the lower portion of the sheet from above the sheet,
   wherein the multiple ejection pins of the multi-transfer unit transfer the multiple light-emitting diodes to the substrate, and
   wherein the sheet placement unit comprises a first alignment unit configured to align a first sheet having multiple first light-emitting diodes, and a second alignment unit configured to align a second sheet having multiple second light-emitting diodes each having a wavelength different from a wavelength of the first light-emitting diode, and the multi-transfer unit simultaneously transfers the multiple first light-emitting diodes to multiple cells and then simultaneously transfers the multiple second light-emitting diodes to the multiple cells.

2. The apparatus of claim 1, wherein the multiple ejection pins of the multi-transfer unit are individually operated.

3. The apparatus of claim 2, wherein the multi-transfer unit transfers some of the light-emitting diodes to the substrate by operating only some of the multiple ejection pins.

4. The apparatus of claim 1, wherein the multi-transfer unit simultaneously transfers the multiple light-emitting diodes to the substrate by operating the multiple ejection pins downward from above the sheet and pushing the multiple light-emitting diodes.

5. The apparatus of claim 1, wherein the multi-transfer unit transfers the multiple light-emitting diodes to the substrate so that an interval between the multiple light-emitting diodes is equal to or a multiple of a pitch between the multiple light-emitting diodes attached to the sheet.

6. The apparatus of claim 1, wherein the other side surface of the light-emitting diode is attached to the sheet, one or more electrodes are positioned on the electrode surface of one side surface opposite to the other side surface, and the ejection pin pushes the other side surface and transfers the light-emitting diode so that the one or more electrodes electrically come into contact with the conductive pattern of the substrate.

7. The apparatus of claim 1, wherein each of the multiple light-emitting diodes is a light-emitting diode having at least one ejection point formed on the other side surface thereof.

8. The apparatus of claim 1, wherein the light-emitting diode module is a display module on which cells comprising red, green, and blue micro light-emitting diodes are arranged at a predetermined interval, and the multi-transfer unit has a structure in which the multiple ejection pins are arranged at the predetermined interval or arranged at an interval which is a multiple of the predetermined interval.

9. The apparatus of claim 1, wherein the multi-transfer unit has a pressure adjustment unit configured to adjust a pressure to be applied to the light-emitting diode from the ejection pin, and the pressure adjustment unit adjusts the pressure to be applied to the light-emitting diode from the ejection pin when the ejection pin transfers the light-emitting diode to the substrate by pushing the light-emitting diode.

10. An apparatus for manufacturing a light-emitting diode module comprising multiple light-emitting diodes each having one side surface from which an electrode surface is exposed, and the other side surface opposite to one side surface, the apparatus comprising:
  a sheet placement unit configured to dispose a sheet having a lower portion to which the other side surface of each of the multiple light-emitting diodes is attached;
  a substrate placement unit configured to dispose, at a position below the sheet and corresponding to the sheet, a substrate having a conductive pattern with which one side surface of each of the multiple light-emitting diodes electrically comes into contact; and
  a multi-transfer unit having multiple ejection pins configured to transfer, to the substrate, the multiple light-emitting diodes attached to the lower portion of the sheet from above the sheet,
  wherein the multiple ejection pins of the multi-transfer unit transfer the multiple light-emitting diodes to the substrate, and
  wherein the multi-transfer unit has a sheet attraction unit configured to attract the sheet, and the sheet attraction unit attracts the sheet to separate the sheet and the light-emitting diode after the ejection pin transfers the light-emitting diode to the substrate by pushing the light-emitting diode.

11. A method of manufacturing a light-emitting diode module comprising multiple light-emitting diodes each having one side surface from which an electrode surface is exposed, and the other side surface opposite to one side surface, the method comprising:
  a sheet placement step of disposing a sheet having a lower portion to which the other side surface of each of the multiple light-emitting diodes is attached;
  a substrate placement step of disposing, at a position below the sheet and corresponding to the sheet, a substrate having a conductive pattern with which one side surface of each of the multiple light-emitting diodes electrically comes into contact; and
  a light-emitting diode transfer step of transferring, to the substrate, the multiple light-emitting diodes attached to the lower portion of the sheet by using a multi-transfer unit positioned above the sheet,
  wherein in the light-emitting diode transfer step, the multi-transfer unit has multiple ejection pins, and the multiple ejection pins transfer, to the substrate, the multiple light-emitting diodes on the sheet, and
  wherein the sheet placement step comprises a first alignment step of aligning a first sheet having multiple first light-emitting diodes, and a second alignment step of aligning a second sheet having multiple second light-emitting diodes each having a wavelength different from a wavelength of the first light-emitting diode, and the light-emitting diode transfer step simultaneously transfers the multiple first light-emitting diodes to multiple cells and then simultaneously transfers the multiple second light-emitting diodes to the multiple cells.

12. The method of claim 11, wherein the other side surface of each of the multiple light-emitting diodes is attached to the sheet, one or more electrodes are positioned on the electrode surface of one side surface opposite to the other side surface, and in the light-emitting diode transfer step, the ejection pin pushes the other side surface and transfers the light-emitting diode so that the one or more electrodes electrically come into contact with the conductive pattern of the substrate.

13. The method of claim 11, wherein each of the multiple light-emitting diodes is a light-emitting diode having at least one ejection point formed on the other side surface thereof.

14. The method of claim 11, wherein in the light-emitting diode transfer step, the multi-transfer unit simultaneously transfers the multiple light-emitting diodes to the substrate by operating the multiple ejection pins downward from above the sheet and pushing the multiple light-emitting diodes.

15. The method of claim 11, wherein in the light-emitting diode transfer step, the multi-transfer unit transfers some of the light-emitting diodes to the substrate by operating only some of the multiple ejection pins.

16. The method of claim 11, wherein in the light-emitting diode transfer step, the multi-transfer unit transfers the multiple light-emitting diodes to the substrate so that an interval between the multiple light-emitting diodes is equal to or a multiple of a pitch between the multiple light-emitting diodes attached to the sheet.

17. The method of claim 11, wherein the sheet placement step aligns the sheet so that the light-emitting diodes selected among the multiple light-emitting diodes are moved to positions corresponding to the multiple ejection pins.

18. The method of claim 11, wherein the light-emitting diode module is a display module on which cells comprising red, green, and blue micro light-emitting diodes are arranged at a predetermined interval, and in the light-emitting diode transfer step, the multiple ejection pins, which are arranged at the predetermined interval or arranged at an interval which is a multiple of the predetermined interval, transfer the multiple light-emitting diodes.

19. The method of claim 11, wherein the multi-transfer unit has a sheet attraction unit configured to attract the sheet, and in the light-emitting diode transfer step, the sheet attraction unit attracts the sheet to separate the sheet and the light-emitting diode after the ejection pin transfers the light-emitting diode to the substrate by pushing the light-emitting diode.

20. The method of claim 11, wherein the multi-transfer unit has a pressure adjustment unit configured to adjust a pressure to be applied to the light-emitting diode from the ejection pin, and in the light-emitting diode transfer step, the pressure adjustment unit adjusts the pressure to be applied to the light-emitting diode from the ejection pin when the ejection pin transfers the light-emitting diode to the substrate by pushing the light-emitting diode.

* * * * *